(12) United States Patent
Usui et al.

(10) Patent No.: US 7,411,684 B2
(45) Date of Patent: Aug. 12, 2008

(54) FILM THICKNESS MEASURING METHOD OF MEMBER TO BE PROCESSED USING EMISSION SPECTROSCOPY AND PROCESSING METHOD OF THE MEMBER USING THE MEASURING METHOD

(75) Inventors: Tatehito Usui, Chiyoda (JP); Takashi Fujii, Kudamatsu (JP); Motohiko Yoshigai, Hikari (JP); Tetsunori Kaji, Tokuyama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/759,536

(22) Filed: Jun. 7, 2007

(65) Prior Publication Data
US 2007/0229845 A1  Oct. 4, 2007

Related U.S. Application Data

(60) Continuation of application No. 11/256,967, filed on Oct. 25, 2005, now Pat. No. 7,230,720, which is a continuation of application No. 10/918,367, filed on Aug. 16, 2004, now Pat. No. 6,961,131, which is a division of application No. 09/797,601, filed on Mar. 5, 2001, now Pat. No. 6,815,228.

(30) Foreign Application Priority Data
Jun. 20, 2000 (JP) ............................. 2000-185359

(51) Int. Cl.
*G01B 11/02* (2006.01)
*G01B 9/02* (2006.01)
*G01J 3/45* (2006.01)

(52) U.S. Cl. ...................... 356/503; 356/451
(58) Field of Classification Search ............. 356/503, 356/504, 630–632
See application file for complete search history.

(56) References Cited

U.S. PATENT DOCUMENTS

| 4,767,495 A | 8/1988 | Nishioka |
| 5,552,016 A | 9/1996 | Ghanayem |
| 5,648,849 A | 7/1997 | Canteloup et al. |

(Continued)

FOREIGN PATENT DOCUMENTS

JP  61-53728  3/1986

(Continued)

*Primary Examiner*—Patrick J Connolly
(74) *Attorney, Agent, or Firm*—Antonelli, Terry, Stout & Kraus, LLP.

(57) ABSTRACT

A system including: a film thickness measuring apparatus for measuring a film thickness of a member to be processed, including: a differential waveform pattern data base for holding a standard pattern consisting of a time differential value of an interference light for each of multiple wavelengths with respect to a film thickness of a first member to be processed; a unit for measuring an intensity of an interference light for each of multiple wavelengths of a second member to be processed; a unit for obtaining a real pattern consisting of time differential values of measured interference light intensities; and a unit for determining a processed amount of the film by using a pattern of zero-cross points of the differential values of intensities of the received interference light for a second wavelength among the received interference lights of the multiple wavelengths.

13 Claims, 21 Drawing Sheets

U.S. PATENT DOCUMENTS

| | | | |
|---|---|---|---|
| 5,658,418 A | 8/1997 | Coronel et al. | |
| 5,835,226 A | 11/1998 | Berman et al. | |
| 5,928,532 A | 7/1999 | Koshimizu et al. | |
| 6,081,334 A | 6/2000 | Grimbergen et al. | |
| 6,207,008 B1 | 3/2001 | Kijima | |
| 6,297,064 B1 | 10/2001 | Koshimizu | |
| 6,815,228 B2* | 11/2004 | Usui et al. | 438/14 |
| 6,903,826 B2* | 6/2005 | Usui et al. | 356/504 |
| 6,961,131 B2* | 11/2005 | Usui et al. | 356/503 |
| 7,009,715 B2* | 3/2006 | Usui et al. | 356/504 |
| 7,126,697 B2* | 10/2006 | Usui et al. | 356/504 |
| 7,230,720 B2* | 6/2007 | Usui et al. | 356/503 |
| 7,259,866 B2* | 8/2007 | Usui et al. | 356/503 |
| 2002/0009814 A1* | 1/2002 | Usui et al. | 438/8 |
| 2003/0043383 A1* | 3/2003 | Usui et al. | 356/504 |
| 2004/0040658 A1* | 3/2004 | Usui et al. | 156/345.24 |
| 2005/0018207 A1* | 1/2005 | Usui et al. | 356/504 |
| 2005/0062982 A1* | 3/2005 | Usui et al. | 356/504 |
| 2005/0194095 A1* | 9/2005 | Usui et al. | 156/345.28 |
| 2005/0202575 A1* | 9/2005 | Usui et al. | 438/7 |
| 2006/0039008 A1* | 2/2006 | Usui et al. | 356/504 |
| 2006/0073619 A1* | 4/2006 | Usui et al. | 438/9 |
| 2006/0132798 A1* | 6/2006 | Usui et al. | 356/504 |

FOREIGN PATENT DOCUMENTS

| | | |
|---|---|---|
| JP | 63-200533 | 8/1988 |
| JP | 64-68932 | 3/1989 |
| JP | 5-179467 | 7/1993 |
| JP | 6-84849 | 3/1994 |
| JP | 8-274082 | 10/1996 |
| JP | 9-61344 | 3/1997 |
| JP | 2000-97648 | 4/2000 |
| JP | 2000-106356 | 4/2000 |

* cited by examiner

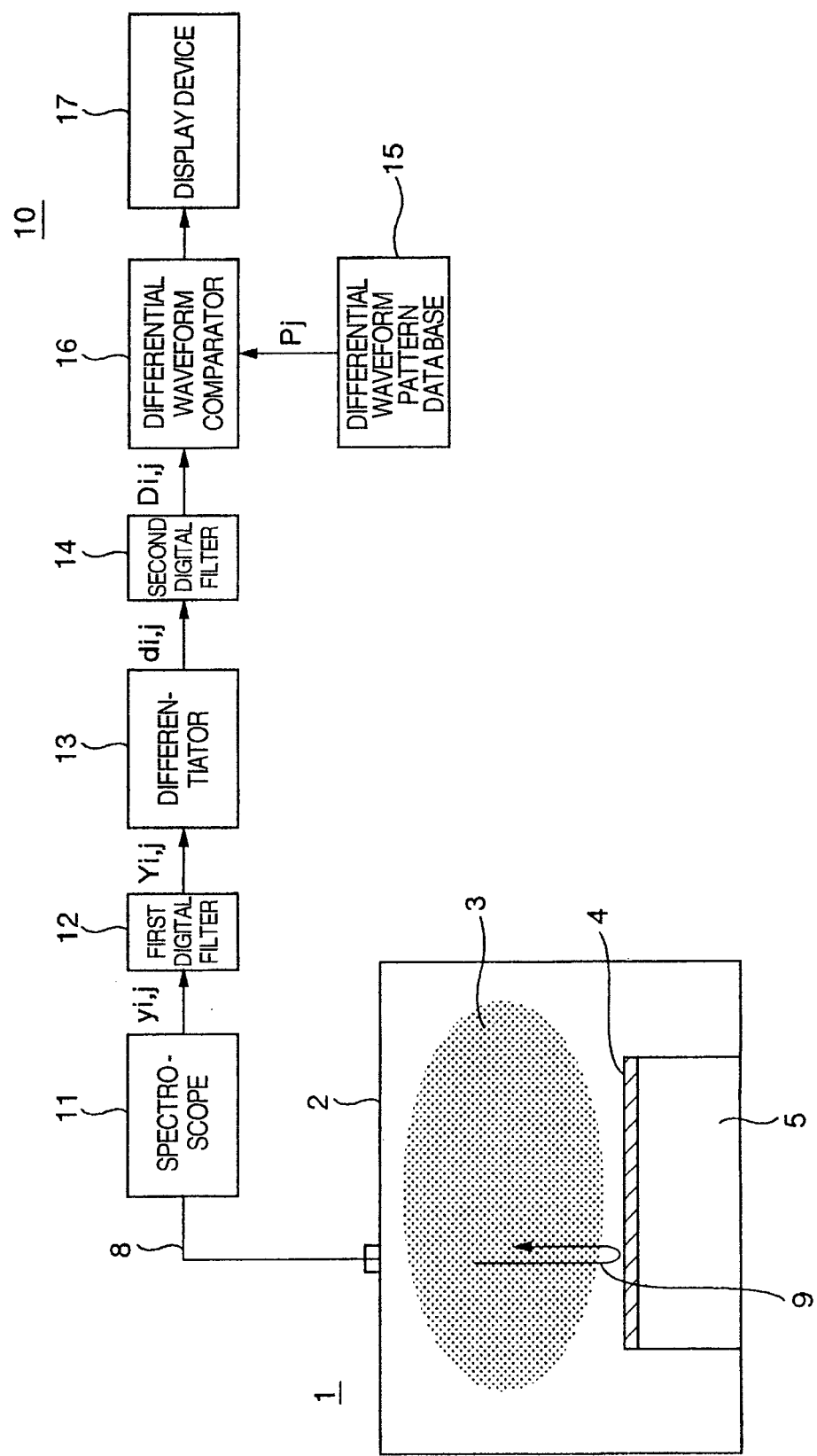

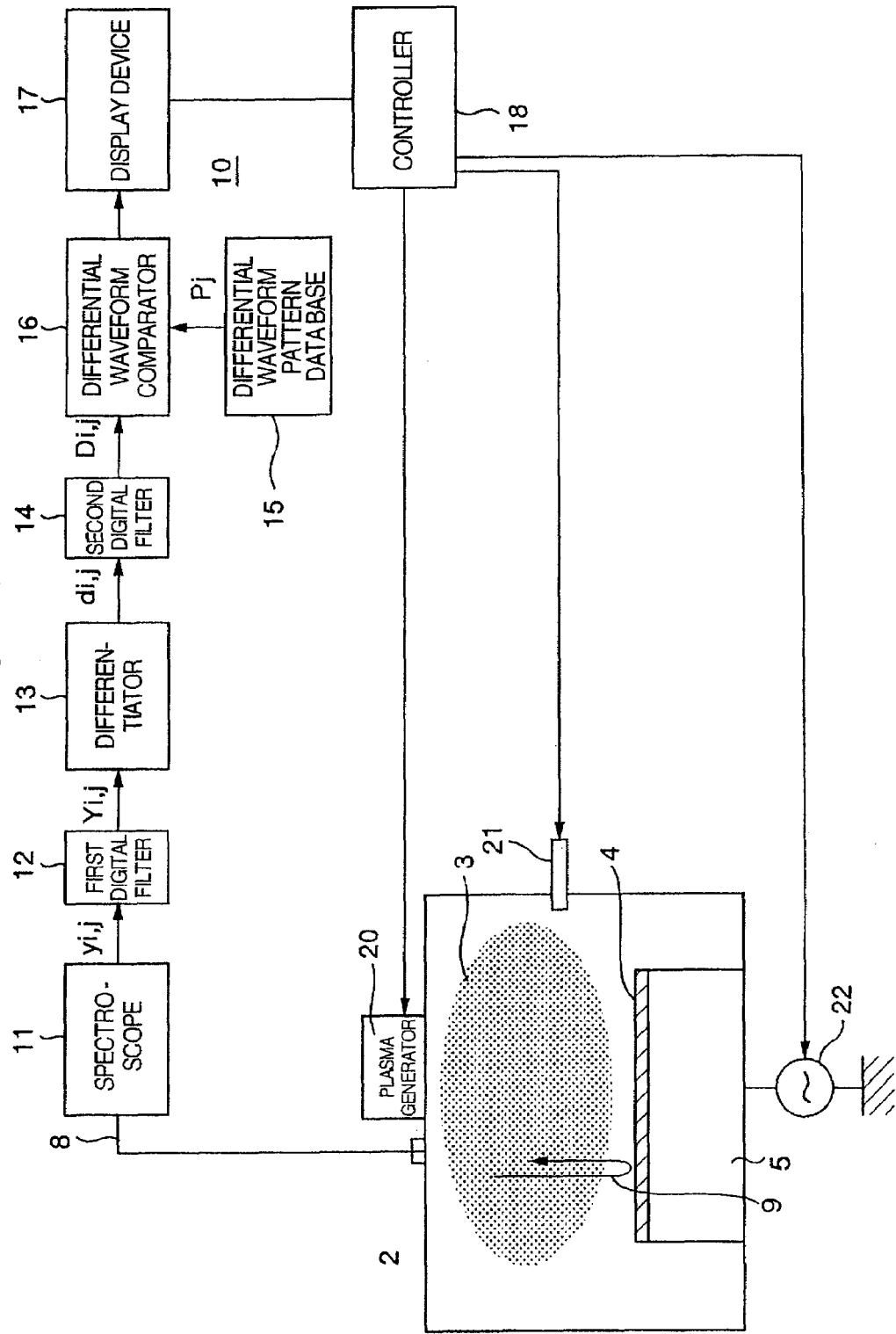

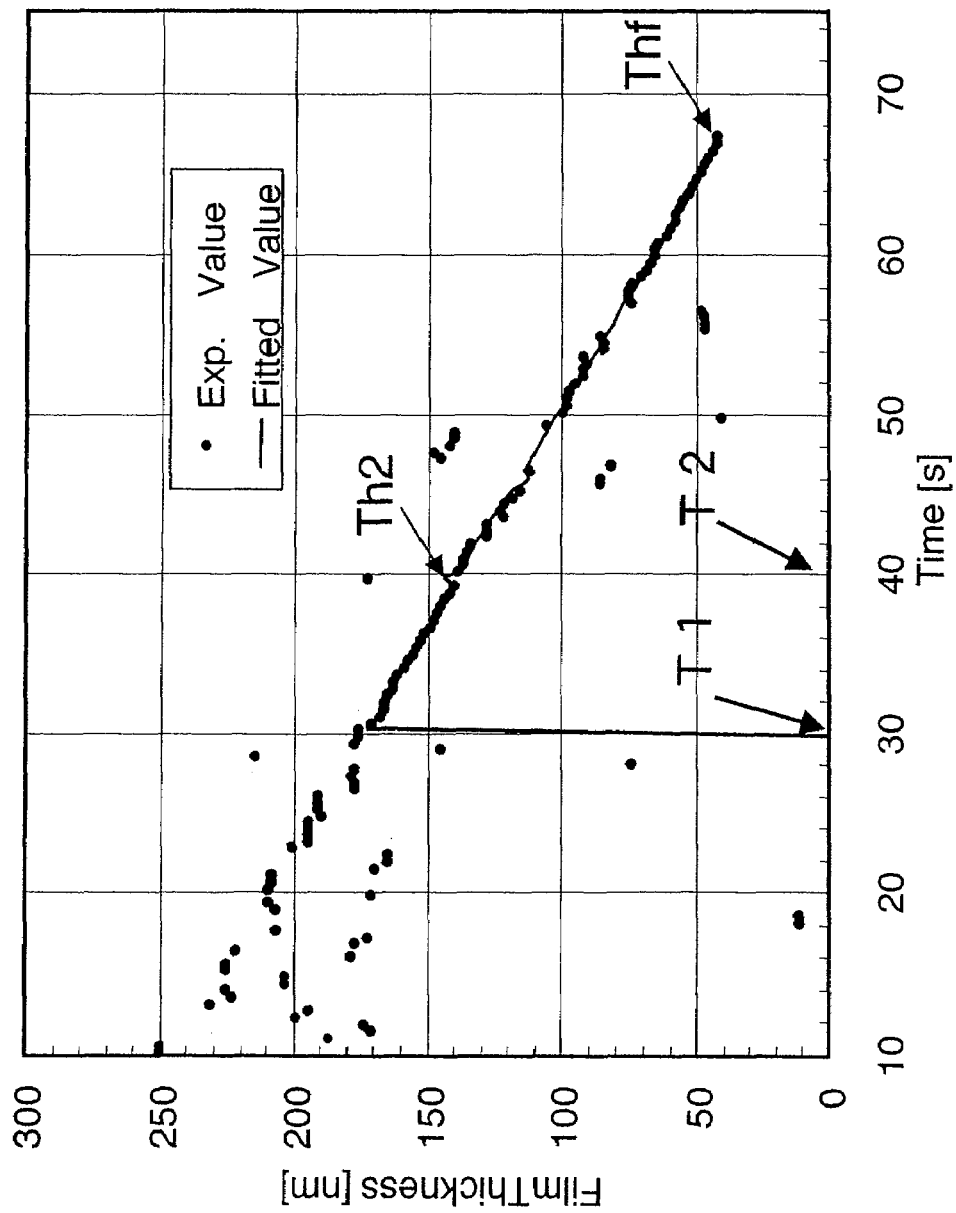

FILM THICKNESS MEASURING METHOD OF MEMBER TO BE PROCESSED USING EMISSION SPECTROSCOPY AND PROCESSING METHOD OF THE MEMBER USING THE MEASURING METHOD

CROSS-REFERENCE TO RELATED APPLICATIONS

This application is a continuation of application Ser. No. 11/256,967, filed Oct. 25, 2005, now U.S. Pat. No. 7,230,720 which is a continuation of application Ser. No. 10/918,367, filed Aug. 16, 2004 (now U.S. Pat. No. 6,961,131), which is a divisional of application Ser. No. 09/797,601 filed on Mar. 5, 2001 (now U.S. Pat. No. 6,815,228), the contents of which are hereby incorporated herein by reference in their entirety.

This application is also related to U.S. patent application Ser. No. 09/452,174 filed Dec. 1, 1999 claiming the Convention Priority based on Japanese Patent Application No. 107271/1999. Further this application relates to and claims priority from Japanese Patent Application No. 2000-185359, filed on Jun. 20, 2000, the contents of all of which are hereby incorporated herein by reference in their entirety.

BACKGROUND OF THE INVENTION

The present invention relates to a film thickness measuring method for detecting a film thickness of a member to be processed with use of an emission spectroscope in such processes as fabrication of semiconductor integrated circuits and a processing method of the member with use of the film thickness measuring method. More particularly, the present invention relates to a film thickness measuring method of members to be processed, preferred so as to measure a film thickness of each layer formed on a substrate in etching processing that employs plasma discharge and obtain a predetermined thickness. The present invention also relates to a processing method of those members with use of the film thickness measuring method.

Dry-etching is one of the main techniques having been employed widely in fabrication processes of semiconductor wafers so as to remove layers formed with various materials thereon. Especially, the dry-etching has been employed to remove dielectric material layers or form patterns on those layers. And, the most important point for controlling process parameters is considered to be decision for endpoints of etching processing so as to stop the etching at each predetermined thickness during the processing.

The light emission intensity of a specific wavelength changes with the progress of the dry-etching processing of semiconductor wafers. One of the conventional etching endpoint detecting methods having been employed for semiconductor wafers, therefore, detects changes of such the light emission intensity of a specific wavelength from plasma during dry-etching processing so as to detect an etching endpoint of a specific film according to this detected emission intensity change. At this time, it is strongly demanded to prevent misdetection of such the endpoint of etching processing, to be caused by irregularity of the detected waveform due to a noise. A well-known method for detecting such the changes of the light emission intensity accurately is disclosed in JP-A-61-53728 and JP-A-63-200533, etc. The moving average method is employed JP-A-61-53728 and the primary least square approximation processing is performed for noise reduction in JP-A-63-200533.

Now that sizes of semiconductors are becoming smaller and the packing density of them is becoming higher, the open area ratio, (area to be etched on a semiconductor wafer) is becoming smaller. And accordingly, the emission intensity of a specific wavelength to be fetched into a light detector from a photo sensor is becoming weaker. As a result, the level of the sampling signal output from the light detector is becoming lower, so that it is becoming difficult for an endpoint determining device to detect endpoints of etching processing accurately according to such the sampling signal output from the light detector.

To detect an endpoint of etching processing so as to stop the etching, it is important that the residual thickness of a dielectric layer should actually become equal to a predetermined value. In the conventional processing, however, all the processes are monitored by a time thickness controlling technique that premises that the etching speed is fixed for all types of layers. An etching speed, for example, is found by processing sample wafers beforehand. According to this method that employs a time monitoring method, therefore, the etching processing stops when a time corresponding to a predetermined etching film thickness is up.

However, an actual film, for example, an $SiO_2$ layer formed by the LPCVD (Low Pressure Chemical Vapor Deposition) method is well known as a layer that is low in reproducibility. The allowable error of film thickness to occur due to a processing fluctuation in the LPCVD is equivalent almost to 10% of the initial thickness of the $SiO_2$ layer. Consequently, the time monitoring method cannot measure the actual final thickness of the $SiO_2$ layer left on the subject silicon substrate. And, final measurement of the actual film thickness is done with use of a standard spectroscopic interferometer. When over-etching is detected, the subject wafer is discarded as an NG one.

It is also well known that an insulation film etching apparatus often causes etching speed-down with time while the etching is repeated. Sometimes, the etching stops on the way. Such the problem must be avoided. In addition, it will also be important to monitor changes of the etching speed with time so as to assure stable etching processing. And, none of the conventional methods has been effective to cope with such the changes and fluctuations of the etching speed with time; the method just monitors the time for determining the end of etching processing. Besides, the decision for the end of etching processing has not been satisfactory when the etching time is as short as about 10 seconds, since the preparing time for the decision, as well as the decision time unit must be as short as possible. Furthermore, an insulation film area to be etched is often less than 1%, so the change of the plasma light emission intensity from a reaction product generated by etching is so small. This is why there has not been practical and reasonable price systems so far, although an etching endpoint decision system that can detect even a slight change of a light emission intensity has been demanded.

On the other hand, there are other well-known methods for detecting endpoints of etching processing on semiconductor wafers. The methods are disclosed in JP-A-5-179467, JP-A-8-274082, JP-A-2000-97648, and JP-A-2000-106356, etc. and each of those methods uses an interferometer. According to those methods that use an interferometer respectively, a monochrome laser beam is exposed at a vertical incidental angle on wafers composed of laminated layers formed with various types of materials. For example, for a wafer consisting of an $SiO_2$ layer and an $SiO_3N_4$ layer laminated thereon, interference fringes appear on the wafer due to a light reflected from the top surface of the $SiO_2$ layer and another light reflected from the boundary face between the $SiO_2$ layer and the $Si_3N_4$ layer. And, the reflected lights are led into a proper detector, thereby generating a signal whose intensity changes according to the thickness of the $SiO_2$ layer during etching processing. When the top surface of the $SiO_2$ layer is exposed during the etching, both of the etching speed and the etched film thickness can be monitored accurately and continuously. Instead of the laser beam, a predetermined light discharged by plasma may be measured with use of a spectrometer. This is also a well-know method.

SUMMARY OF THE INVENTION

According to such a method that uses an interferometer, the position of a boundary face between laminated layers can be measured accurately. However, appearance of interference fringes due to a light reflected from the top surface of a layer and another light reflected from a boundary face means that the processing has reached the boundary face. Measurement of the position of the boundary face cannot be done before that. In actual etching processing, therefore, over-etching cannot be avoided for the target layer even when the thickness of the target film is measured online according to the interference fringes caused by those reflected lights and the information that the processing has reached the boundary face is fed back to the process control. To avoid such over-etching, therefore, the time monitoring method described above should be employed together, although the film thickness and other items must be preset in that case. And, it is becoming difficult more to do proper etching for the reasons described above under the circumstances in recent years, since higher integration of semiconductors is demanded.

Each of the conventional methods disclosed in the above gazettes will be summarized as follows.

JP-A-5-179467 discloses a method that three color filters (red, green, and blue) are used to detect an interference light (plasma light), thereby detecting endpoints of etching processing.

On the other hand, JP-A-8-274082 (corresponding to U.S. Pat. No. 5,658,418) discloses a method that changes of the interference waveforms of two wavelengths with time and their differential waveforms are used to count the extreme values (maximum and minimum values of each waveform: zero-cross points of each differential waveform) of the interference waveforms. Then, the time until the count reaches a predetermined value is measured, thereby obtaining an etching speed. And, the remaining etching time required until a predetermined film thickness is reached is measured according to the obtained etching speed, thereby stopping the etching processing according to the measured remaining etching time.

JP-A-2000-97648 discloses a method that obtains a difference waveform (that uses a wavelength as a parameter) between a light intensity pattern (that uses a wavelength as a parameter) of an interference light before processing and a light intensity pattern of the interference light after or during processing and comparing the obtained waveform with the difference waveform read from the data base, thereby measuring a difference in level (film thickness).

And, JP-A-2000-106356 discloses a rotary coating apparatus and a method for measuring a film thickness by measuring changes of an interference light with time with respect to each of multiple wavelengths.

And, U.S. Pat. No. 6,081,334 discloses a method that measures characteristic changes of an interference light with time and accumulates the measured data in a data base so as to detect an endpoint of etching processing by comparing a measured interference waveform with that read from the data base. This decision requires the etching processing conditions to be updated.

The well-known examples described above, however, have been confronted with the following problems.

(1) As members to be etched are becoming thinner, the interference light intensity is becoming lower and the number of interference fringes to appear is reduced.

(2) When a masking material (ex., resist) is used in etching processing, an interference light from the subject member to be etched is overlaid on another interference light from the masking material.

(3) The interference waveform is warped with a change of the etching speed during the processing.

Due to the above problems, it has been difficult to measure and control the thickness of a layer to be processed, especially a layer to be processed in plasma etching processing at a required precision.

Under such circumstances, it is an object of the present invention to provide a film thickness measuring method that can measure an actual thickness of a layer to be processed online precisely in plasma processing, especially in plasma etching processing, as well as a processing method of the layer using the measuring method.

It is another object of the present invention to provide etching processing that can control each layer of a semiconductor device to a predetermined thickness online precisely.

It is still another object of the present invention to provide a film thickness measuring apparatus for a member to be processed. The method can measure an actual thickness of a layer to be processed precisely online.

In order to solve the conventional problems described above and achieve the above objects of the present invention, at first, a time differential waveform is found from an interference waveform with respect to each of a plurality of wavelengths. And, according to the found waveform, a pattern that denotes the wavelength dependence of the subject interference waveform differential value is found (that is, a pattern of a differential value of an interference waveform that uses a wavelength as a parameter). The pattern is then used to measure the thickness of a target film.

The reasons why the present invention in this specification uses a pattern denoting the wavelength dependence of a time differential value of an interference waveform are as follows:

Because film thickness measurement premises in-situ (real time) measurement during etching, the film thickness of the target film to be processed changes time to time. Consequently, time differential processing is possible for interference waveforms. Besides, this differential processing can remove noise from interference waveforms.

Furthermore, the refractivity of the member to be etched (ex., polysilicon) changes significantly with respect to a wavelength. Consequently, interference light measurement by an interferometer makes it possible to detect characteristic changes (film thickness dependence) of the member with respect to each of multiple wavelengths.

According to an aspect of the present invention, the film thickness measuring method for measuring a film thickness of a member to be processed comprises the steps of:

a) setting a standard pattern for a differential value of an interference light with respect to a predetermined film thickness of a first (sampling) member to be processed, the standard pattern using a wavelength as a parameter;

b) measuring the intensity of an interference light of a second member to be processed, composed just like the first member, with respect to each of a plurality of wavelengths, thereby obtaining a real pattern for a differential value of the measured interference light intensity, the real pattern using a wavelength as a parameter; and c) obtaining a film thickness of the second member according to both of the standard pattern and the real pattern of the differential value.

The present invention described above may be modified as follows:

At first, in case the film of a material, which is a member to be etched, is thick, interference fringes will appear cyclically. In such a case, an absolute film thickness can be found using an interference light that has more than three wavelengths.

On the other hand, in case the film of the material, which is a member to be processed, is thin, interference fringes will not appear cyclically. In this case, therefore, an absolute film thickness can be found using an interference light that has two wavelengths.

According to the present invention, therefore, it is possible to provide a film thickness measuring method of members to be processed. The method can measure an actual thickness of a layer to be processed online precisely in plasma processing, especially in plasma etching, as well as a processing method of sample members to be processed with use of the measuring method.

Furthermore, it is possible to provide etching processing method that can control each layer of a semiconductor device to a predetermined thickness online precisely. It is also possible to provide a film thickness measuring apparatus of members to be processed. The apparatus can measure an actual thickness of a layer to be processed online precisely.

Furthermore, according to the present invention, it is possible to provide a film thickness measuring method of members to be processed. The method can measure an actual thickness of a layer to be processed online precisely in plasma processing, especially in plasma etching, as well as a processing method of sample members to be processed with use of the measuring method.

Furthermore, it is possible to provide an etching method that can control each layer of a semiconductor device to a predetermined thickness online precisely. It is also possible to provide a film thickness measuring apparatus of members to be processed. The apparatus can measure an actual thickness of such a layer to be processed online precisely.

BRIEF DESCRIPTION OF THE DRAWINGS

FIG. 1 is an entire block diagram of an etching apparatus of a semiconductor wafer, provided with a film thickness measuring apparatus in the first embodiment of the present invention;

FIG. 18 is an entire block diagram of an etching apparatus for semiconductor wafers, which is provided with a film thickness measuring apparatus in the sixth embodiment of the present invention;

FIG. 21 is a graph showing a film thickness changes at the time of etching of polysilicon on an undercoating oxide film in the eighth embodiment.

DETAILED DESCRIPTION OF THE EMBODIMENTS

Figure 2A:
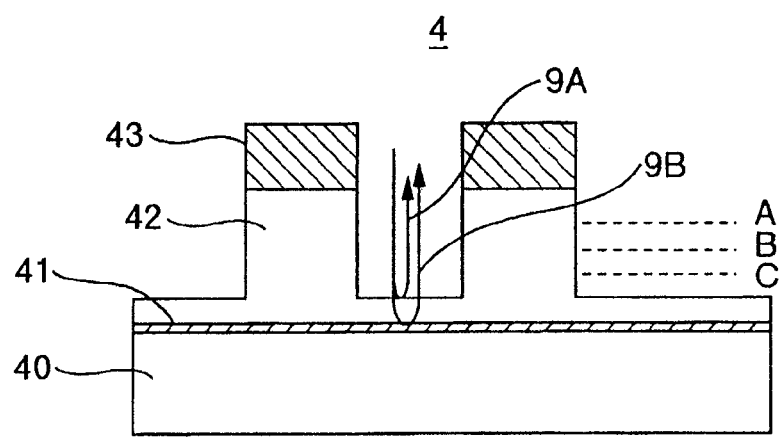
FIG. 2A is a cross sectional view of a member to be processed in etching processing and 2B shows a real pattern of a wavelength of an interference light.

Hereunder, the preferred embodiments of the present invention will be described with reference to the accompanying drawings. In each of the embodiments, the same reference numbers will be given to the items having the same functions as those in the first embodiment, avoiding redundant description.

Hereinafter, the first embodiment of the present invention will be described with reference to FIGS. 1 through 4. In this first embodiment, a standard pattern denoting the wavelength dependence of a differential value of an interference light (a wavelength is used as a parameter) is set for plasma-etching of such members as wafers, etc. with respect to a predetermined film thickness of the sample member to be processed. Then, the intensity of an interference light is measured with respect to each of a plurality of its wavelengths in actual processing of a member composed just like the sample member. This is to find a real pattern denoting the wavelength dependence of a differential value of the measured interference light intensity (a wavelength is used as a parameter), thereby comparing the standard pattern of the differential value with the real pattern so as to find the film thickness of the member.

At first, a description will be made for the entire block diagram of the semiconductor wafer etching apparatus provided with a film thickness measuring apparatus of the present invention. The etching apparatus 1 has a vacuum chamber 2. An etching gas supplied into this vacuum chamber 2 is decomposed into plasma 3 by a microwave electric power or the like. This plasma 3 is then used to etch such a member as semiconductor wafer, etc. to be processed on a sample stand 5. A light having a plurality of wavelengths from a measurement light source (ex., halogen lamp) of a spectroscope 11 of the film thickness measuring apparatus 10 is led into the vacuum chamber 2 via an optical fiber 8, then exposed to the member 4 at a vertical incident angle. The member 4 has a polysilicon layer in this embodiment. A light reflects from the top surface of the polysilicon layer and it is combined with another light reflected from a boundary face between the polysilicon layer and the undercoating material, thereby forming an interference light. The interference light is led into the spectroscope 11 of the film thickness measuring apparatus 10 via the optical fiber 8. According to the state of the interference light, the film thickness is measured and the endpoint of etching process is detected.

The film thickness measuring apparatus 10 is provided with a spectroscope 11; a first digital filter 12; a differentiator 13; a second digital filter 14; a differential waveform pattern data base 15; a differential waveform comparator 16; and a display device 17 used to display the result of the comparison performed in the comparator 16. As described above, FIG. 1 is a mechanical configuration of the film thickness measuring apparatus 10. The actual configuration of the film thickness measuring apparatus 10 except for the display device 17 and the spectroscope 11 may be modified so as to have a CPU; such storages as a ROM used to hold various types of data, such as film thickness measuring programs, a differential waveform pattern data base of interference lights, etc., a RAM used to hold measured data, external storages, etc., data input/output devices, and a communication controller.

The light emission intensity having multiple wavelengths, fetched by the spectroscope 11 becomes a current detection signal corresponding to the light emission intensity. It is then converted to a voltage signal. The signal having multiple specific wavelengths, output as a sampling signal from the spectroscope 11 is stored as time series data yij in such a storage as a RAM, etc. This time series data yij is smoothed by the first digital filter 12, then stored as smoothed time series data Yij in such a storage as a RAM, etc. According to this smoothed time series data Yij, the differentiator 13 calculates time series data dij of a differential coefficient value (first or second differential value), which is then stored in such a storage as a RAM, etc. The time series data dij of the differential coefficient value is smoothed by the second digital filter 14, then stored as smoothed differential coefficient time series data Dij in such a storage as a RAM, etc. And, a real pattern (that uses a wavelength as a parameter) denoting wavelength dependence of a differential value of an interference light intensity is found from this smoothed differential coefficient time series data Dij.

On the other hand, in the differential waveform pattern data base 15 is preset a differential waveform pattern data value $P_j$ of an interference light intensity corresponding to each of the multiple wavelengths corresponding to the material that is subject to a film thickness measurement, for example, polysilicon. The differential waveform comparator 16 compares the real pattern with the differential waveform pattern data value Pj so as to find the film thickness of the subject member to be processed. The result is displayed on the display device 17.

While only one spectroscope 11 is used in this embodiment, a plurality of spectroscopes 11 may be used when measurement must be controlled so as to measure the internal surfaces of the member.

Figure 2B:
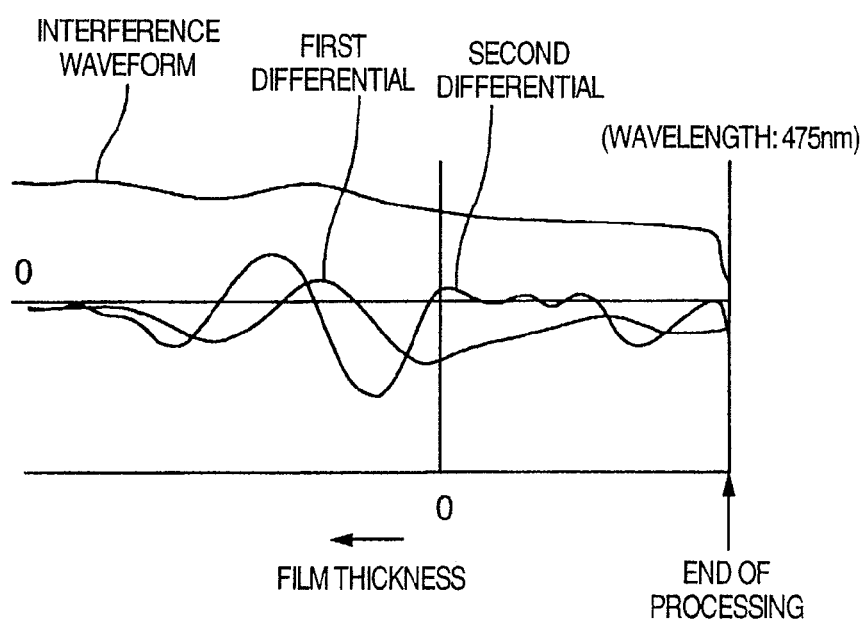

FIG. 2A shows a cross sectional view of the member 4 during etching processing and FIG. 2B shows a real pattern of an interference light wavelength. In FIG. 2A, the member (wafer) 4 is composed of laminated layers of an undercoating material 41, a member to be etched 42, and a masking material 43 on a substrate 40. For example, when in etching of a gate film, the substrate of the wafer 4 is an $SiO_2$ insulation film and a polysilicon gate layer is formed on a polycrystal undercoating material corresponding to between source and drain.

A light having multiple wavelengths, emitted from the spectroscope 11 is exposed at a vertical incident angle on the member 4 consisting of laminated layers of a material to be etched and an undercoating material. The light 9 led to an etched portion where no masking material 43 exists reflects from the top surface of the member 42 and from the boundary face formed between the material 42 and the undercoating material 41, so that the reflected light 9A from the top surface of the material 42 and the light 9B reflected from the boundary face are combined to form an interference light. The light 9A changes its reflection point like A, B, C while the etching processing proceeds. The reflected lights are then led into the spectroscope 11 so as to generate a signal whose intensity changes according to the thickness of the layer of the member 42 during etching processing.

As shown in FIG. 2B, the smoothed time series data Yij of the raw waveform (having multiple wavelengths) of an interference light keeps a comparatively large value until the distance from the boundary face becomes almost zero. At a point close to zero, the data Yij is reduced suddenly. The right side of a point where the distance from the boundary face is zero denotes overetching processing. And, according to this smoothed time series data Yij, the differential coefficient time series data dij of the first or second differential value is calculated. FIG. 2B shows both first and second differential values of an interference light having a wavelength of 475 nm. The first and second differential values cross the zero value at a plurality of points within a distance from the boundary face. Hereinafter, a point where this zero value is crossed will be referred to as a zero-cross point.

As shown clearly in FIG. 2B, a zero-cross point also appears at a point where the distance value from a boundary face is large, that is, where the film is comparatively thick. This is a great difference from a case in which a film thickness is not changed so much until the raw waveform reaches almost the boundary face and it is reduced suddenly around a zero-cross point. The inventor of the present invention has turned his attention to this fact so as to measure a comparatively thick film accurately. And, because the first and second differential values of an interference light keep large values even when the plasma output becomes lower, the film thickness can be measured accurately.

Figure 3A:
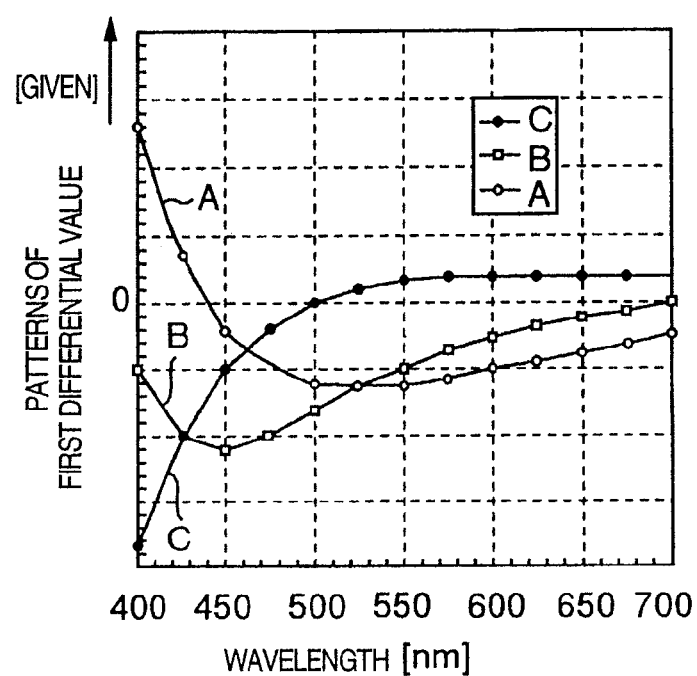
FIGS. 3A and 3B are graphs for denoting differential coefficient time series data of an interference light corresponding to each film thickness (distance from a boundary face) denoted as A, B, and C of FIGS. 2A and 2B while a wavelength is used as a parameter for the data.
Figure 3B:
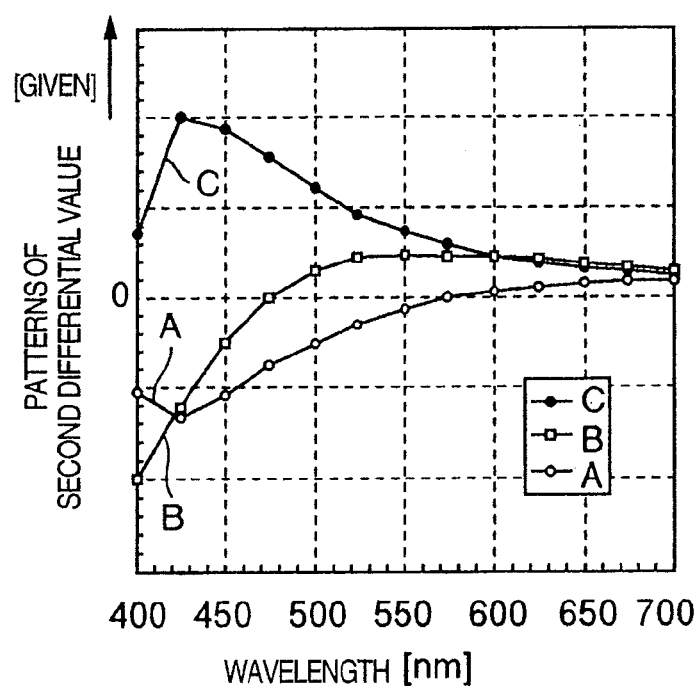

FIGS. 3A and 3B are graphs denoting the first and second differential value patterns (standard patterns)(each of those patterns uses a wavelength as a parameter) of differential values of an interference light with respect to each of predetermined film thickness values denoted as A, B, and C of a member to be processed (polysilicon) shown in FIG. 2A. The patterns are shown as patterns of differential coefficient time series data dij of an interference light corresponding to each film thickness (distance from a boundary face). FIG. 3A shows the first differential waveform pattern of the interference light. In the same way, FIG. 3B shows the second differential waveform pattern of the interference light. A, B, and C shown in FIG. 3B denote differential waveform pattern data at each of film thickness values A(=30 nm), B(=20 nm), and C(=10 nm) in FIG. 2A.

As shown clearly in FIGS. 3A and 3B, the first and second differential waveform patterns of an interference light are specific to a member to be processed and each film thickness. In a specific waveform, the zero-cross points can be known. In other words, it is known that the first and second differential values become zero. For example, for the film thickness C, a wavelength of 500 nm is a zero-cross point. When the member to be processed is changed, the pattern is also changed. This is why the first and second differential waveform patterns should be recorded in a storage. Those patterns are obtained by tests performed beforehand with respect to various member and film thickness values required for processing.

Figure 4:
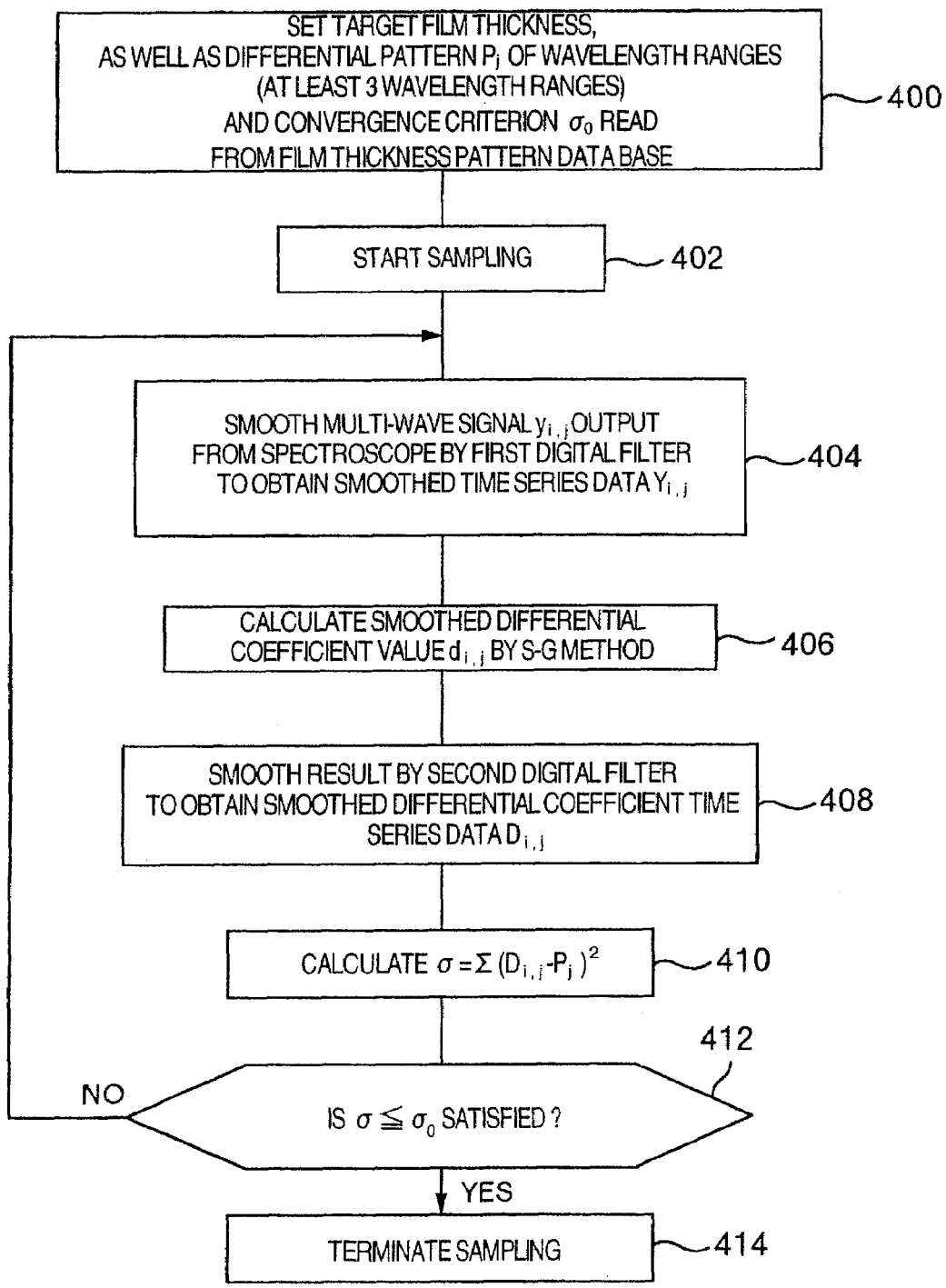
FIG. 4 is a flowchart of a procedure for detecting a film thickness of a member to be processed when the film thickness measuring apparatus shown in FIG. 1 is used in the etching processing.

Next, a description will be made for how to find a film thickness of a member to be processed when in etching by the film thickness measuring apparatus 10 shown in FIG. 1 with reference to the flowchart shown in FIG. 4.

At first, the target film thickness value, as well as a differential pattern Pi in wavelength ranges (at least three wavelength ranges), and a criterion σ0 that are read from the film thickness pattern data base are set (step 400). Concretely, at least three standard patterns are set in correspondence to required film thickness values according to the processing conditions for the member to be processed. The three standard patterns are selected from those of a differential value having multiple wavelengths as shown in FIGS. 3A and 3B. They are held beforehand in the differential waveform pattern data base 15.

In the next step 402, sampling of an interference light is started (for example, at intervals of 0.25 to 0.4 sec.). Concretely, when etching processing is started, a sampling start command is issued. And, a light emission intensity having multiple wavelengths, to be changed with the progress of etching processing is detected by a light detector as a voltage signal corresponding to the light emission intensity. The detected signal output from the spectroscope 11 is converted to a digital signal, that is, a sampling signal $y_{i,j}$.

After this, the multiple-wavelength signal $y_{i,j}$ output from the spectroscope is smoothed by the first digital filter 12 to time series data $Y_{i,j}$ (step 404). Concretely, noise of the data is reduced by the first digital filter so as to obtain smoothed time series data yi.

Then, the S-G method is used to calculate the differential coefficient $d_{i,j}$ (step 406). Concretely, the coefficient di (first or second) of a signal waveform is obtained by a differentiation processing (S-G method). Then, the data is smoothed by the second digital filter 14 to smoothed differential coefficient time series data $D_{i,j}$ (step 408). Then, the $\sigma=\Sigma(D_{i,j}-P_j)^2$ value is calculated (step 410). Next, the differential waveform comparator 16 checks whether or not σ≦σ0 is satisfied (step 412). When σ≦σ0 is satisfied, it is judged that the film thickness of the member to be processed has reached a predetermined value. The result is displayed on the display device 17. When σ≦σ0 is not satisfied, control returns to step 404. Finally, end of the sampling is set (step 414).

Hereinafter, how to obtain smoothed differential coefficient time series data Di will be described. The digital filter may be, for example, a secondary Bataworth low-pass filter. The smoothed time series data Yi is obtained by the expression (1) with use of the Bataworth low-pass filter.

$$Yi = b1yi + b2yi-1 + b3yi-2 - [a2Yi-1 + a3Yi-2] \quad (1)$$

Here, the coefficients b and a are varied according to the sampling frequency and the cut-off frequency. For example, when the sampling frequency is 10 Hz and the cut-off frequency is 1 Hz, the a and b values will be as shown below.

a2=−1.143, a3=0.4128, b1=0.067455, b2=0.13491, b3=0.067455

The time series data di of a second differential coefficient value is obtained by the differential coefficient arithmetic circuit 6 as follows in the expression (2) with use of the polynomial adaptation smoothing differential method of the time series data Yi at five points.

$$di = \sum_{j=-2}^{j=2} wjYi+j \quad (2)$$

Here, w−2=2, w−1=−1, w0=−2, w1=−1, and w2=2 are satisfied.

The smoothed differential coefficient time series data Di is obtained by a digital filter (a secondary Bataworth low-pass filter as shown in the expression (3). May be different from the a and b coefficients of the digital filter) with use of the differential coefficient value time series data di described above.

$$Di = b1di + b2di-1 + b3di-2 - [a2Di-1 + a3-Di-2] \quad (3)$$

The film thickness measuring apparatus shown in FIG. 1 can thus detect a film thickness of a member to be processed such way by setting at least one of the standard patterns of a differential value denoted as A, B, and C in FIGS. 3A and 3B with respect to each of a plurality of wavelengths, measuring the intensity of an interference light of the member with respect to each of those wavelengths, obtaining a real pattern of the differential value of the measured interference light intensity with respect to each wavelength, and comparing the standard pattern with the real pattern of the differential value. For example, when a film thickness of 30 nm, that is, a film thickness denoted as A in FIG. 2, is to be detected, a standard pattern of a differential value is set with respect to each of a plurality of wavelengths corresponding to the film thickness A, thereby a film thickness of 30 nm is detected for the member to be processed when the matching rate of the real pattern to the standard pattern with respect to each of those wavelengths reaches a criterion of τ0 or under. The standard pattern may be one or both of first and second differential value patterns.

According to this embodiment, therefore, the film thickness of the subject member to be processed can be measured precisely even when the distance from a boundary face is, for example, as long as 30 nm.

Next, a second embodiment of the present invention will be described with reference to FIGS. 5 through 7. In this embodiment, it is possible to preset two conditions so as to detect that the film thickness of the subject member to be processed has reached to a predetermined value according to a standard pattern of a differential value corresponding to a predetermined film thickness. The two conditions are matching with a wavelength λ0 at one zero-cross point in this standard pattern and reaching of the matching rate between a differential value in another wavelength λp and the standard pattern of the actual value to the criterion σ0 or under.

Figure 5:
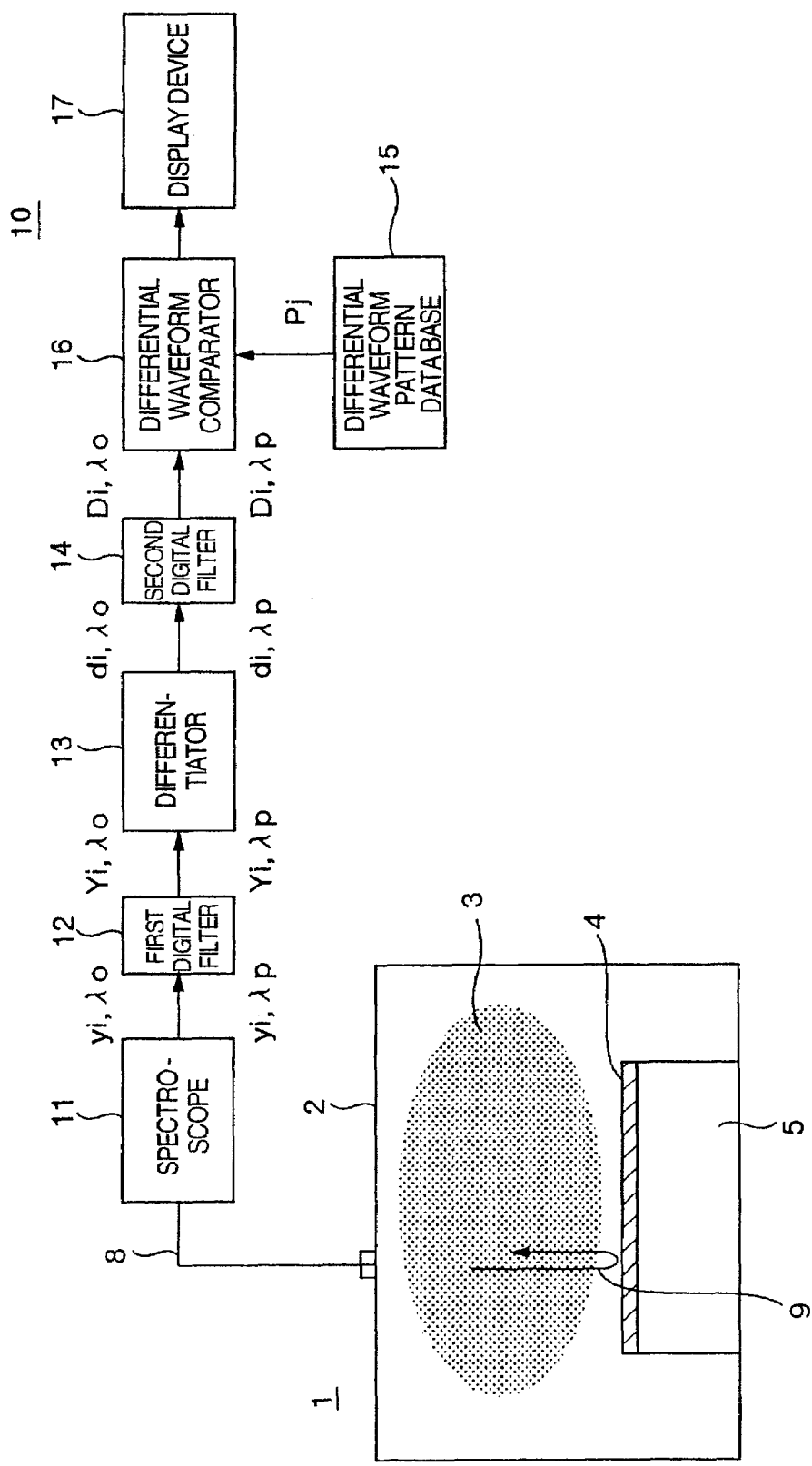
FIG. 5 is an entire block diagram of an etching apparatus for semiconductor wafers, which is provided with a film thickness measuring apparatus in the second embodiment of the present invention.
Figure 6:
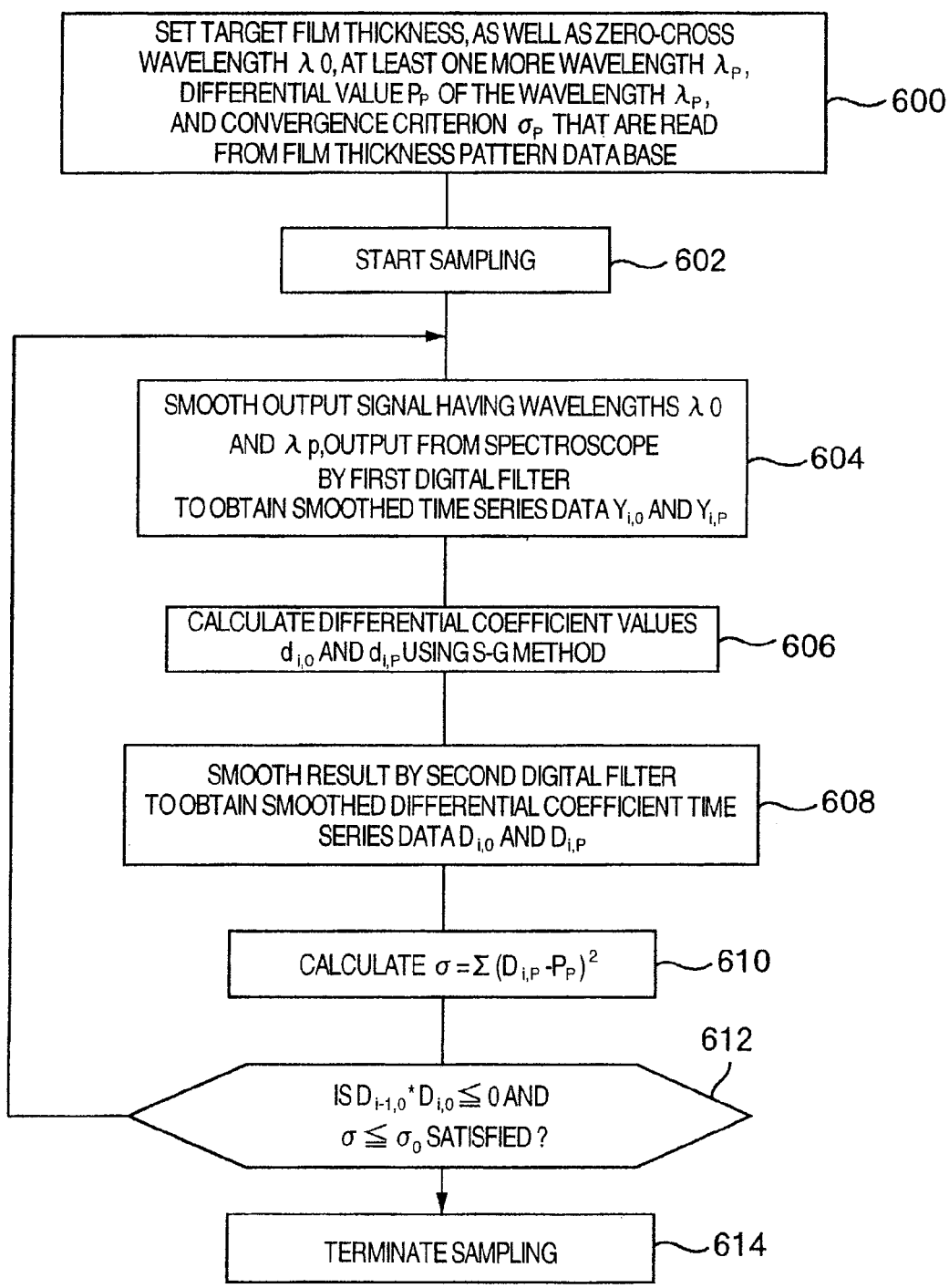
FIG. 6 is a flowchart of the operation of the embodiment shown in FIG. 5.

In FIG. 5, a sampling signal having two specific wavelengths, output from the spectroscope 11, is stored in such a not-shown storage as a RAM as time series data yi, λo and yi, λp. Those time series data items are then smoothed by the first digital filter 12 and stored in a storage as smoothed time series data items Yi, λo, Yi, and λp. And, according to those smoothed time series data items Yi, λo and Yi, λp, the differentiator 13 calculates time series data items di, λo and di, λp of a differential coefficient value (first or second differential values), then stores those data items in a storage. Those differential value time series data items are then smoothed by the second digital filter 14 to smoothed differential coefficient time series data items Di, λo and Di, λp, which is stored in a storage. Such way, a real pattern is found for a differential value from those smoothed differential coefficient time series data items Di, λo and Di, and λp with respect to each wavelength of an interference light intensity.

On the other hand, in the differential waveform pattern data base 15 are preset a wavelength λ0 at a zero-cross point in the standard pattern and a standard pattern of a differential value of another wavelength of λp. The differential waveform comparator 16 then performs a comparison between those standard patterns so as to find the film thickness of the member to be processed.

For example, when a film thickness of 30 nm, that is, the film thickness A shown in FIG. 2A, is to be detected, the wavelength at the zero-cross point λ0 and the first differential value Pp corresponding to another wavelength λp=450 nm are set.

The components 12 to 16 in this embodiment may be included in a computer provided with a CPU, memories, etc.

Hereinafter, the operation of this embodiment will be described with reference to the flowchart shown in FIG. 6. At first, a target film thickness, as well as a wavelength λo at a zero-cross, at least one more wavelength λp, the differential value Pp of the wavelength λp, and a criterion λp that are read from the data base are set respectively (step 600).

Then, sampling of an interference light of the member to be processed is started (step 602) so as to smooth a signal having wavelengths λ0 and λp output from the spectroscope by the first digital filter to obtain smoothed time series data items Yi, o and Yi, p (step 604).

Then, the S-G method is used to obtain differential coefficients di, o and di, p (step 606). After this, the obtained coefficients are further smoothed by the second digital filter to obtain smoothed differential coefficient time series data items Di, o and Di, p (step 608). Then, $\sigma=\Sigma(Di,p-pp)^2$ is calculated (step 610).

After this, a sign check is done for Di−1,o*Di,o≦0 and σ≦σ0 (step 612).

In case the sign check of Di−1,o*Di,o is minus, the result is decided as true. In case σ≦σ0 is satisfied, the film thickness judgment is ended (step 614). In case the sign check of Di−1, o*Di,0 is decided as plus or in case σ≦σ0 is satisfied, control returns to step 604.

Figure 7:
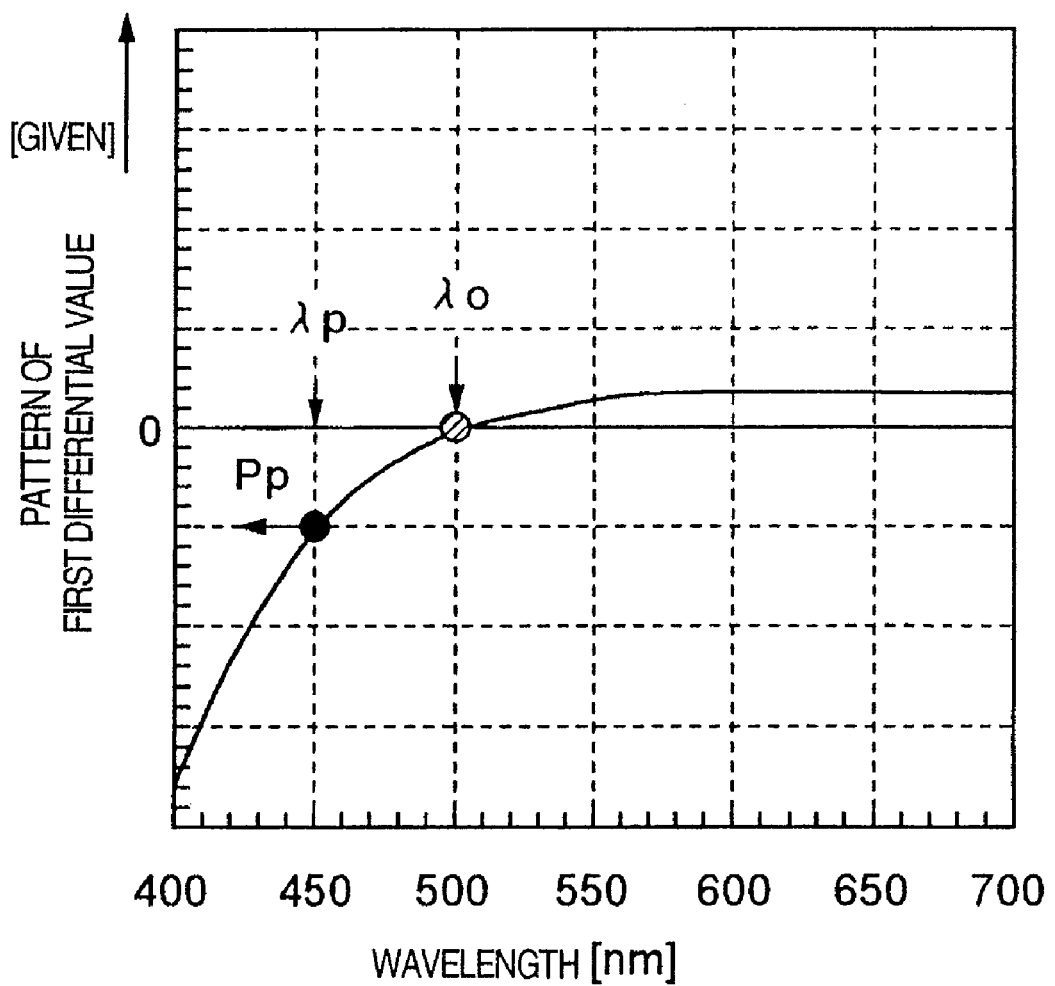
FIG. 7 is a graph for denoting the operation of the embodiment shown in FIG. 5.

According to this embodiment, therefore, it is possible to measure a film thickness of a member to be processed accurately only by paying attention to two specific wavelengths, concretely by detecting that a differential value pattern shown in FIG. 7 crosses zero (X axis) at λ0 and the differential value Pp of another wavelength λp reaches the criterion σ0. Especially, it is possible to measure a film thickness of a member to be processed accurately even when the distance value from a boundary face is as large as 30 nm.

Hereunder, a third embodiment of the present invention will be described with reference to FIGS. 8 through 10. In this embodiment, a film thickness of a member to be processed is found from the number of zero-cross points n after a zero-cross pattern Pj of a differential value of a target wavelength λT is set and a zero-cross pattern of a differential value of an actual interference light intensity of the member is found in an interference light with respect to a predetermined film thickness of the member.

Figure 8:
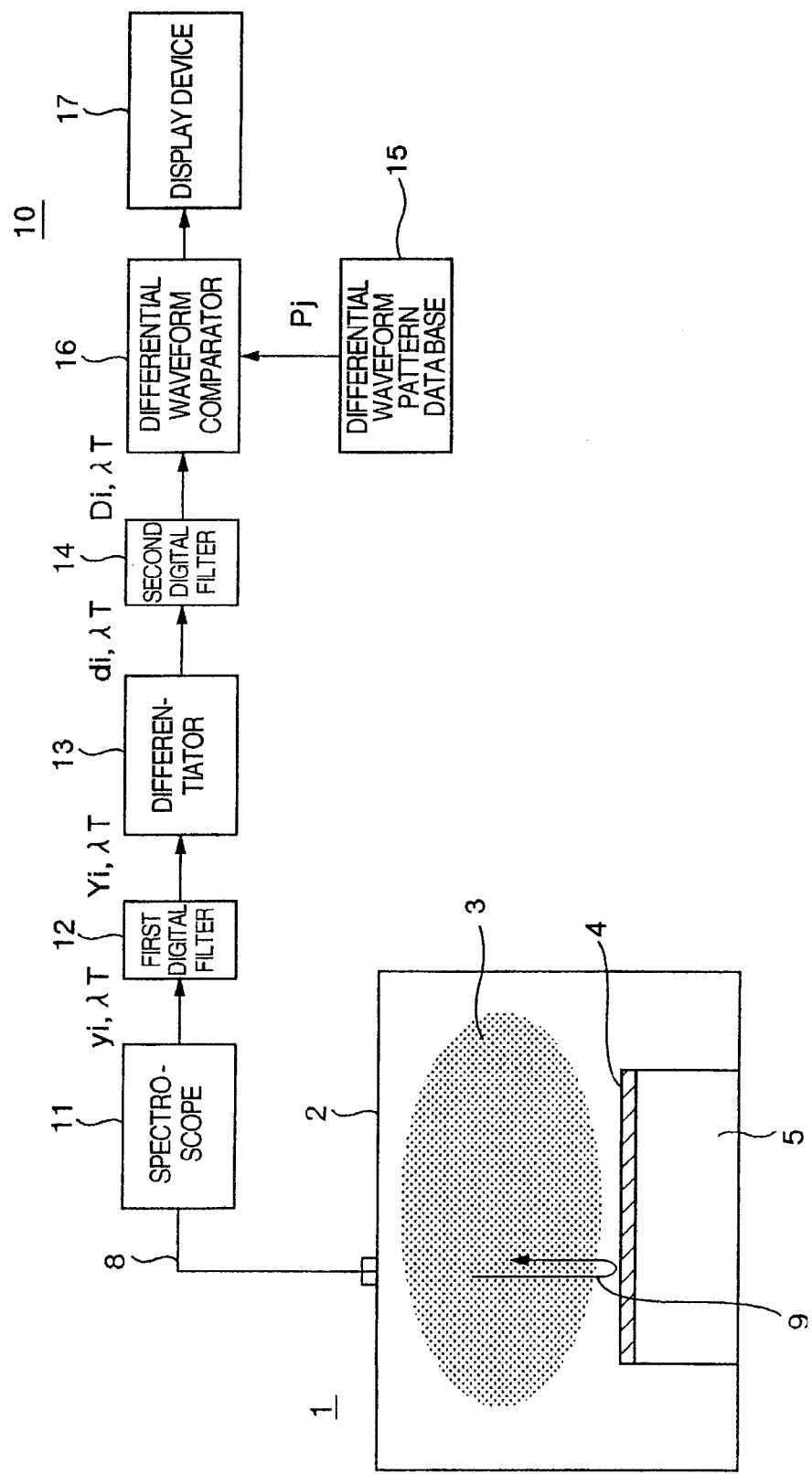
FIG. 8 is an entire block diagram of an etching apparatus for semiconductor wafers, which is provided with a film thickness measuring apparatus in the third embodiment of the present invention.

In FIG. 8, the sampling signal having a target wavelength of λT, output from the spectroscope 11, is stored as time series data yi,λT in such a storage (not illustrated) as a RAM. This time series data is then smoothed by the first digital filter 12 to smoothed time series data Yi,λT, which is stored in a storage. According to this smoothed time series data, the differentiator 13 calculates time series data di,λT of a differential value (first or second differential value), then stores the result in a storage. The time series data of this differential value is further smoothed by the second digital filter 14 to smoothed differential coefficient time series data Di,λT, which is stored in a storage. On the other hand, in the differential waveform pattern data base 15 is preset data of a zero-cross pattern Pj (standard pattern). The differential waveform comparator 16 then compares this smoothed differential coefficient time series data with the zero-cross pattern Pj of the differential value so as to find the film thickness of the member to be processed from the number of zero-cross points.

Figure 9:
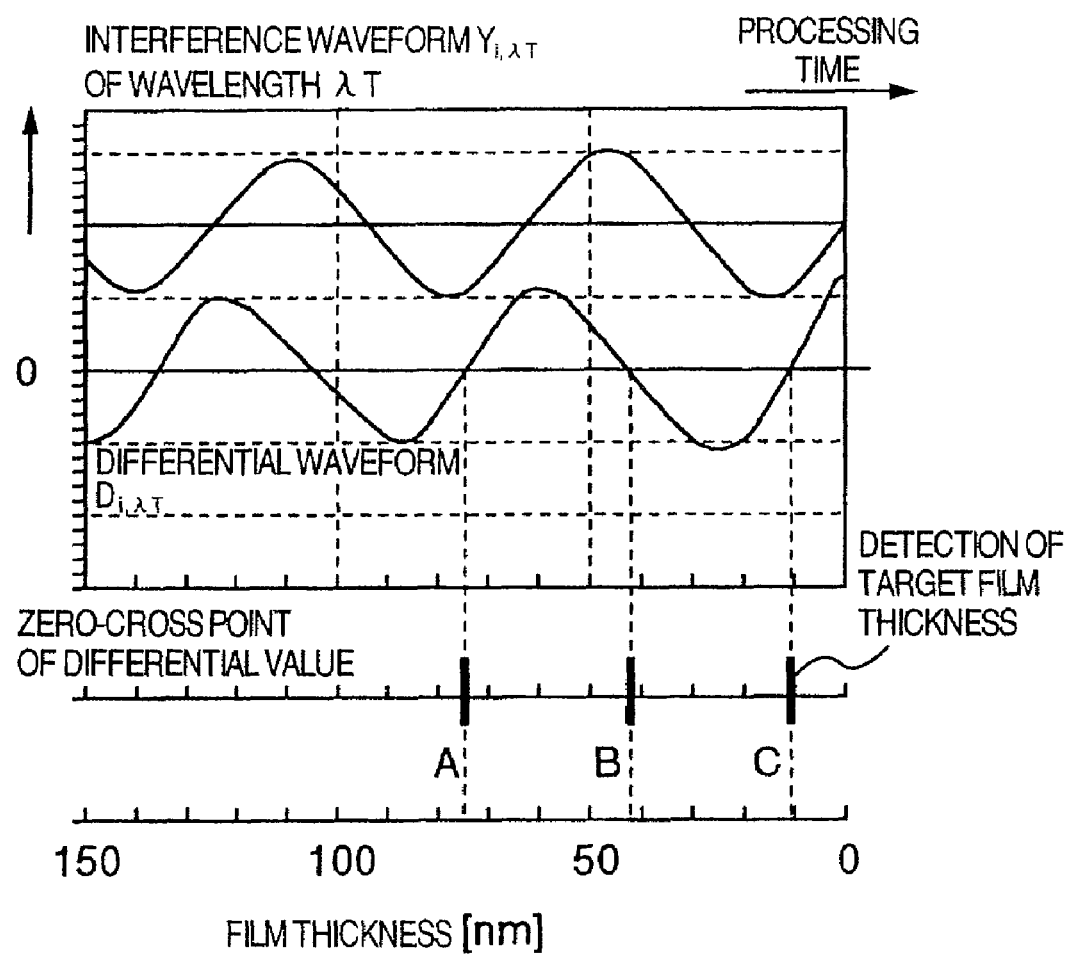
FIG. 9 is a graph for describing the operation of the embodiment shown in FIG. 8.
Figure 10:
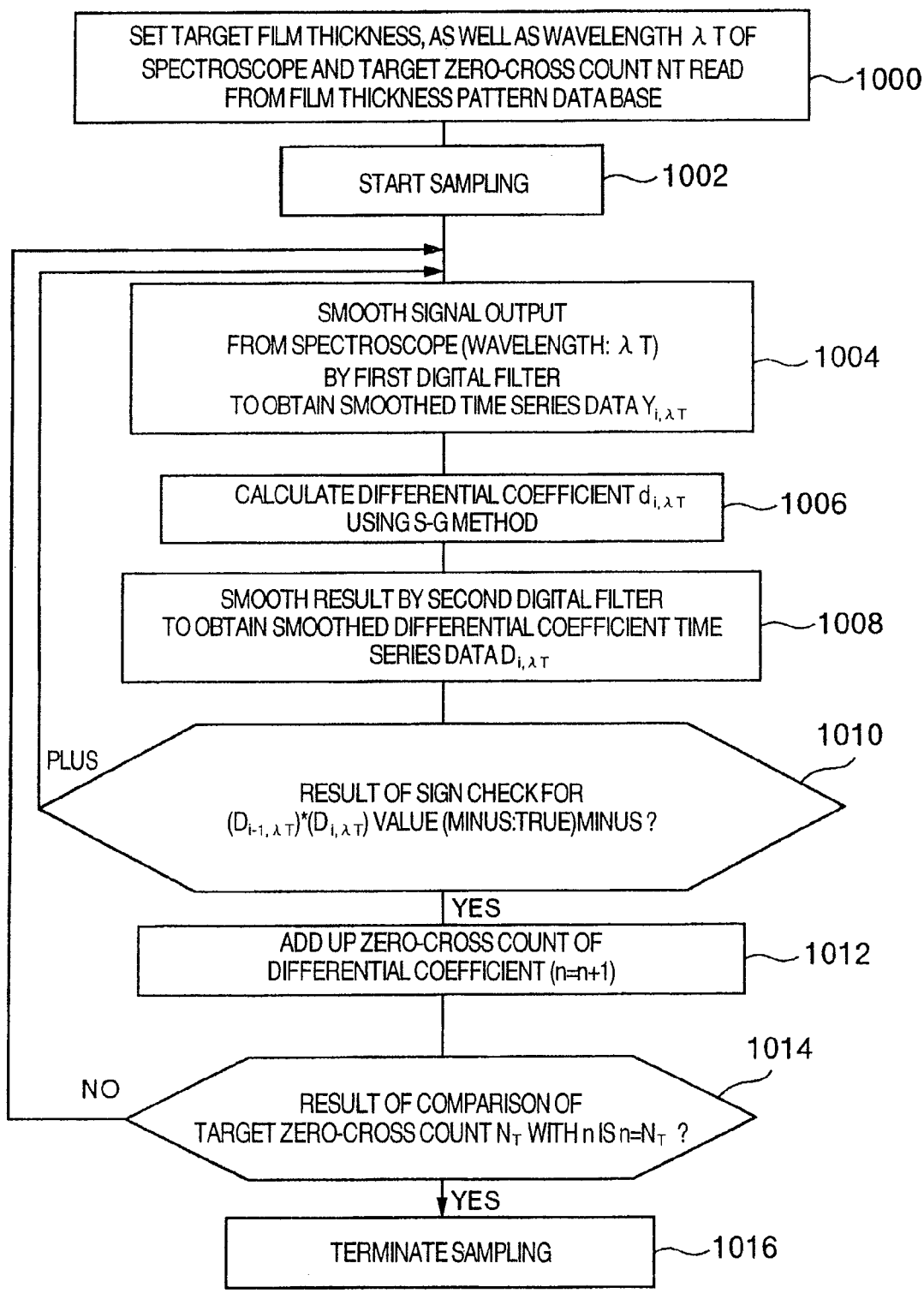
FIG. 10 is a flowchart for describing the operation of the embodiment shown in FIG. 8.

As shown in FIG. 9, for example, in case the three zero-cross points of the target wavelength λT correspond to A, B, and C (film thickness values), it is possible to detect a film thickness of, for example, 10 nm at the point C by detecting that the differential value has passed those zero-cross points.

The components 12 to 16 in this embodiment may also be included in a computer provided with a CPU, memories, etc.

Hereunder, the operation of this embodiment will be described with reference to the flowchart shown in FIG. 10.

At first, the target film thickness value, as well as the spectroscope wavelength λT and the target zero-cross count NT that are read from the film thickness pattern data base are set (step 1000). Then, the sampling is started (step 1002). After this, the signal output from the spectroscope (wavelength: λT) is smoothed by the first digital filter to smoothed time series data Yi,λT (step 1004). And, the S-G method is used to calculate a differential coefficient di,λT (step 1006). The smoothed differential coefficient time series data Di,λT is further smoothed by the second digital filter to smoothed differential coefficient time series data Di,λT (step 1008).

Then, a sign check is done for the (Di−1,λT)*(Di,λT) value so as to detect the zero-cross of the differential coefficient according to the relationship of minus=true (step 1010). The zero-cross count of the differential coefficient is added up (n=n+1)(step 1012), then the n value is compared with the target zero-cross count NT (step 1014). In case the target zero-cross count NT is not reached yet, control returns to step 1004. In case the count NT is reached, it is decided that the predetermined film thickness is reached. The sampling is thus terminated.

According to this embodiment, therefore, it is possible to measure a film thickness of a member to be processed even when the distance value from a boundary face is comparatively large, since a zero-cross pattern Pj of a differential waveform of a specific wavelength λT is set so as to find the film thickness of the member from the actual pattern zero-cross count.

Next, a description will be made for a fourth embodiment of the film thickness measuring method of the present invention with reference to FIGS. 11 through 14. This embodiment finds a film thickness of a target member to be processed from the zero-cross pattern of the differential value having the target wavelength λT within a film thickness range. The film thickness range is found from the zero-cross pattern of the differential value having a guide wavelength λG, which is selected together with the target wavelength λT from specific wavelengths in an interference light of the member.

Figure 11:
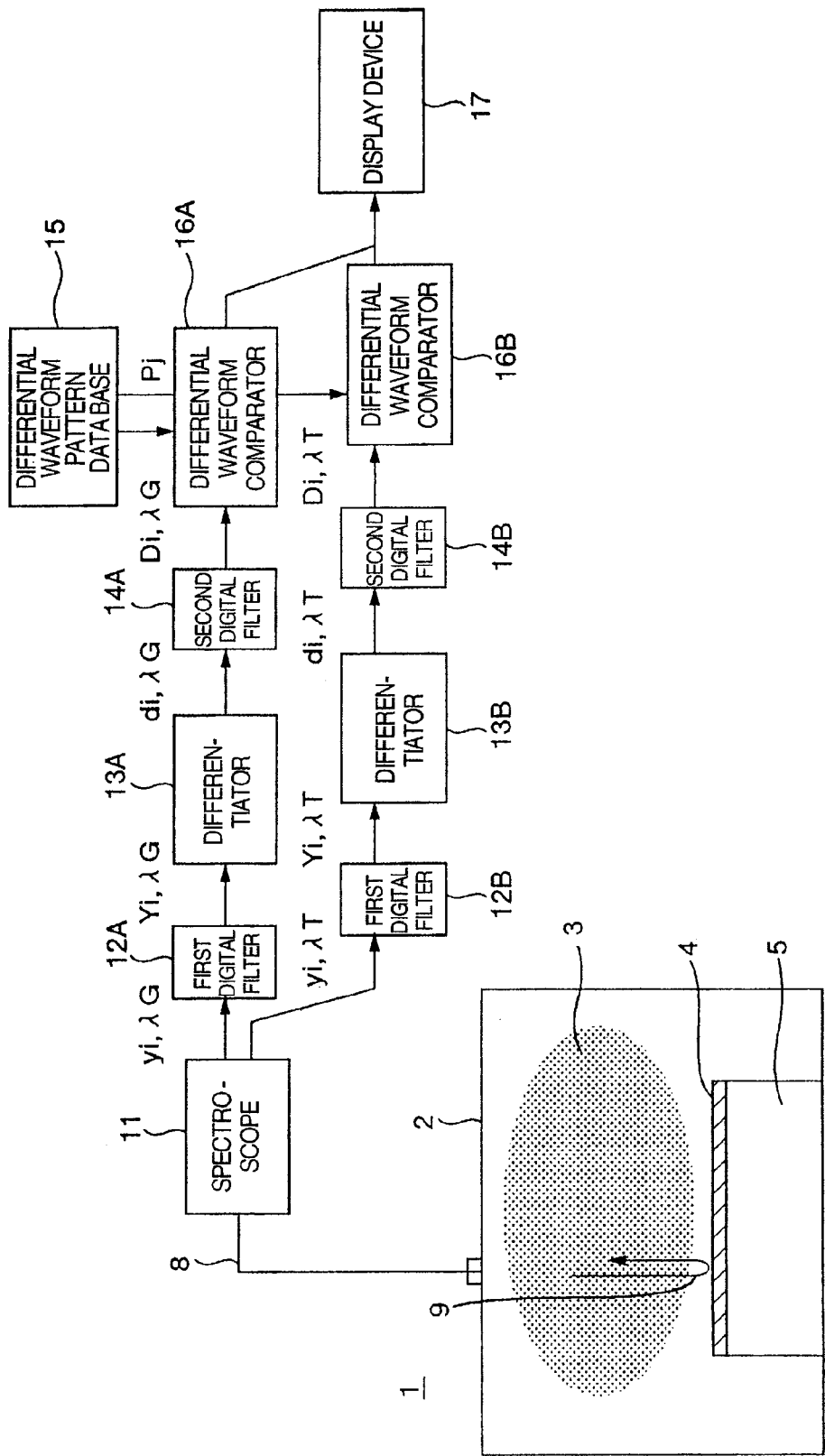
FIG. 11 is an entire block diagram of an etching apparatus for semiconductor wafers, which is provided with a film thickness measuring apparatus in the fourth embodiment of the present invention.

In FIG. 11, a sampling signal having two specific wavelengths is output from the spectroscope 11 and the signal is stored in a storage (not illustrated) as time series data items yi,λG and yi,λT. Those time series data items are smoothed by two first digital filters 12 (12A and 12B) and stored in a storage as smoothed time series data items Yi,λG and Yi,λT. According to those smoothed time series data items, the two differentiators 13 (13A and 13B) calculate time series data items di,λG and di,λT of a differential value (first or second differential value), then store the obtained data items in a storage. Those differential coefficient time series data items are further smoothed by two second digital filters 14 (14A and 14B) and stored in a storage as smoothed differential coefficient time series data items Di,λG and Di,λT. On the other hand, in the differential waveform pattern data base 15 is preset data of the zero-cross pattern of wavelengths λG and λT. The two differential waveform comparators 16 (16A and 16B) then compare those smoothed differential coefficient time series data items with the differential value zero-cross pattern Pj so as to find the film thickness of the target member to be processed.

The components 12A, 12B to 16A, and 11B in this embodiment may also be included in a computer provided with a CPU, memories, etc.

Figure 12:
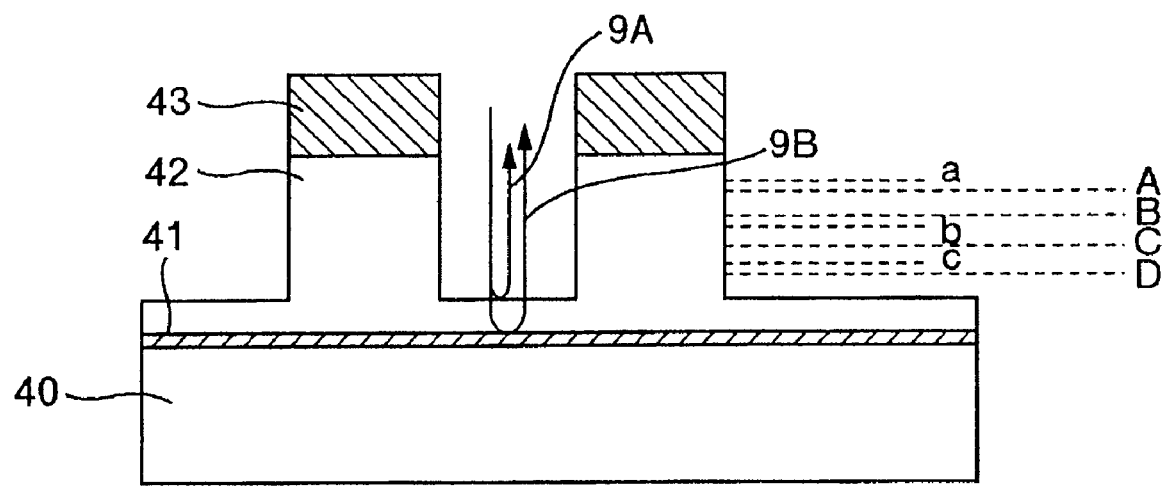
FIG. 12 is a cross sectional view of a member to be processed in etching process in the embodiment of FIG. 11.
Figure 13:
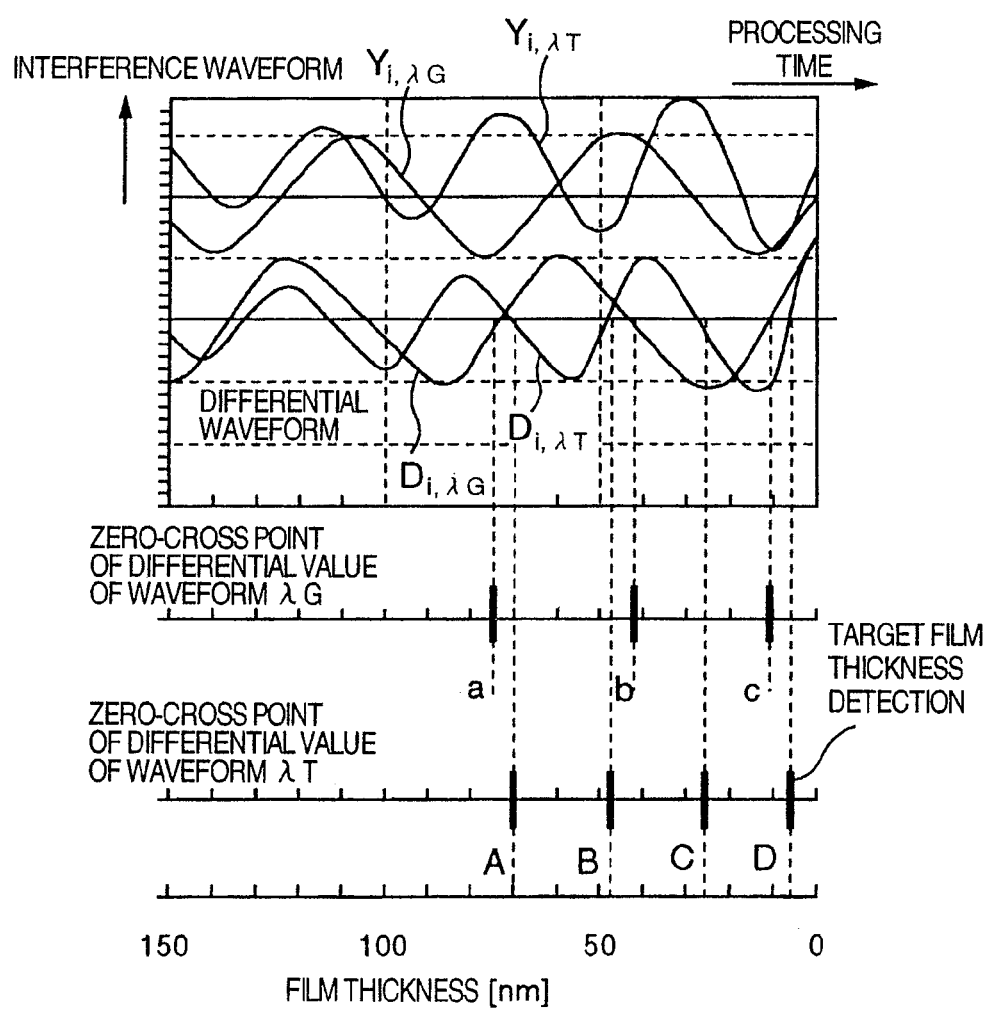
FIG. 13 is a graph for denoting the operation of the embodiment shown in FIG. 11.

Here, a description will be made for the relationship between the data of the zero-cross pattern Pj of wavelengths λG and λT with reference to FIGS. 12 and 13. In FIGS. 12 and 13, four zero-cross points of the target wavelength λT correspond to A, B, C, and D (film thickness) and three zero-cross points of the guide wavelength λG correspond to a, b, and c (film thickness) respectively. FIG. 13 shows the relationship between the three zero-cross points of the guide wavelength λG corresponding to film thickness values a, b, and c, as well as the four target film thickness values, that is, the four zero-cross points of the target wavelength λT and each film thickness.

Consequently, for example, in case measurement is done for the film thickness D, which is assumed as a target film thickness, the zero-cross point of the guide wavelength λG corresponding to the film thickness c appears preceding the zero-cross point of the target wavelength λT corresponding to the film thickness D. It will thus be understood that the target film thickness D is reached when three zero-cross points are detected for the guide wavelength λG and four zero-cross points are detected for the target wavelength λT.

Figure 14:
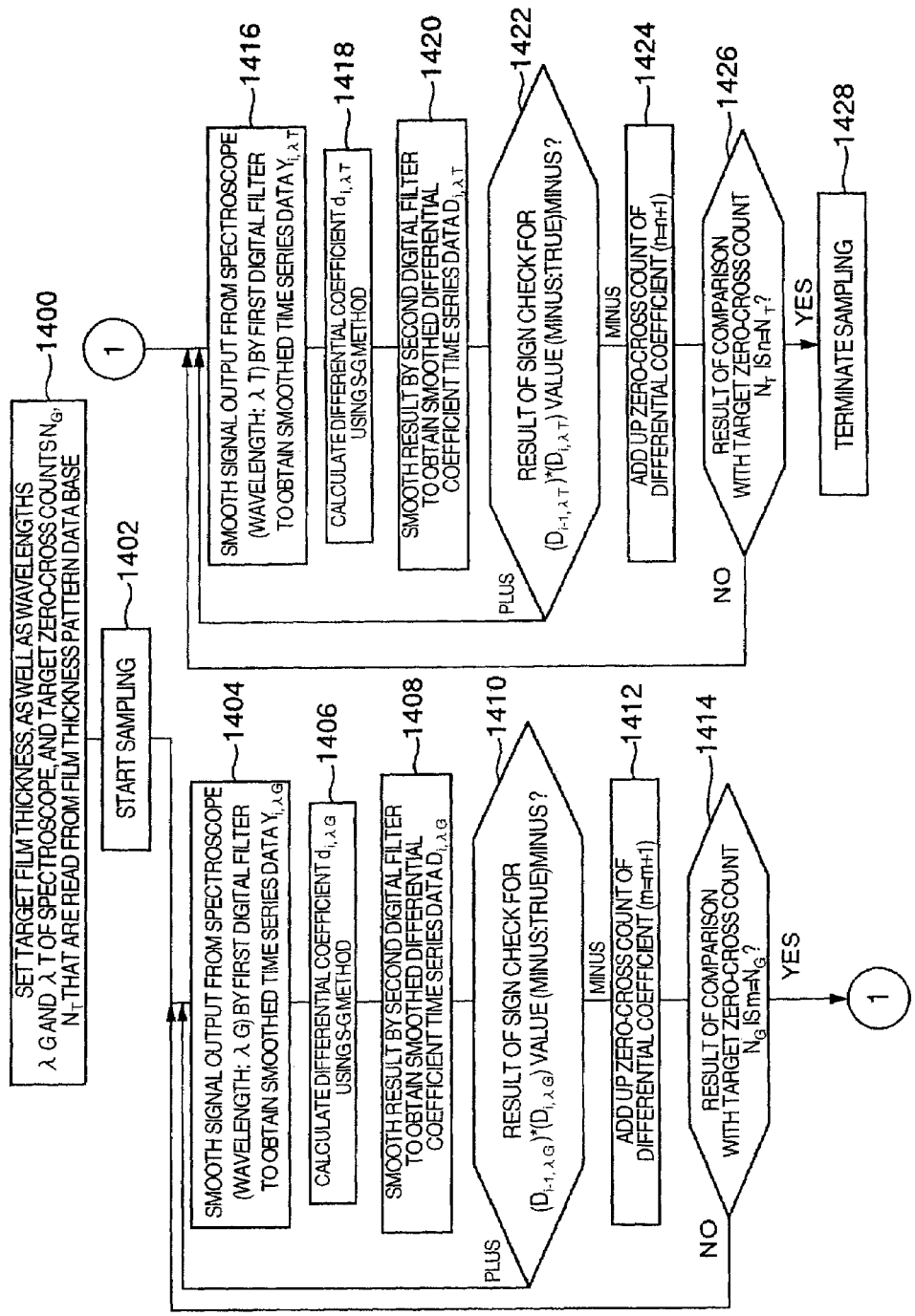
FIG. 14 is a flowchart for describing the operation of the embodiment shown in FIG. 11.

Hereunder, the operation of this embodiment will be described with reference to the flowchart shown in FIG. 14. At first, the guide wavelength λG and the target wavelength λT of the spectroscope, as well as the target zero-cross counts NG and NT of each wavelength read from the film thickness pattern data base are set respectively (step 1400).

Then, the output signal of the spectroscope (wavelength λG) is smoothed by the first digital filter to obtain smoothed time series data Yi,λG in order to know the target zero-cross count m of the guide wavelength λG (step 1402). In addition, the differential coefficient di,λG is calculated by the S-G method (step 1404). The obtained data is further smoothed by the second digital filter to obtain smoothed differential coefficient time series data Di,λG (step 1406). Then, a sign check is done for the (Di−1, λG)*(Di,λG) value (minus=true) so as to detect a zero-cross of the differential coefficient (step 1410). When the zero-cross is detected, the zero-cross count of the differential coefficient is added up (m=m+1) (step 1412) so as to compare the zero-cross count with the target zero-cross count NG (step 1414). When the target zero-cross count m is reached, the processing advances to find the target zero-cross count n of the target wavelength λT.

Then, in order to find the target zero-cross count n of the target wavelength λT, the output signal from the spectroscope (wavelength λT) is smoothed first by the first digital filter to smoothed time series data Yi,λT (step 1416). Then, the differential coefficient di,λT is calculated by the S-G method (step 1418). In addition, the data is smoothed by the second digital filter to smoothed differential coefficient time series data Di,λT (step 1420). Then, a sign check is done for the (Di−1,λT)*(Di,λT) (minus=true) so as to detect the zero-cross of the differential coefficient (step 1422). When the zero-cross is detected, the zero-cross count of the differential coefficient is added up (n=n+1)(step 1424) so as to compare the result with the target zero-cross count NT (step 1426). When the target zero-cross count n is reached, the result is recorded and output, since the target film thickness is reached. Thus, the sampling is terminated.

According to this embodiment, therefore, it is possible to measure a film thickness of a member to be processed accurately even when the distance value from the boundary face is comparatively large, since the film thickness is decided according to the zero-cross counts of the guide wavelength λG and the target wavelength λT.

Figure 15:
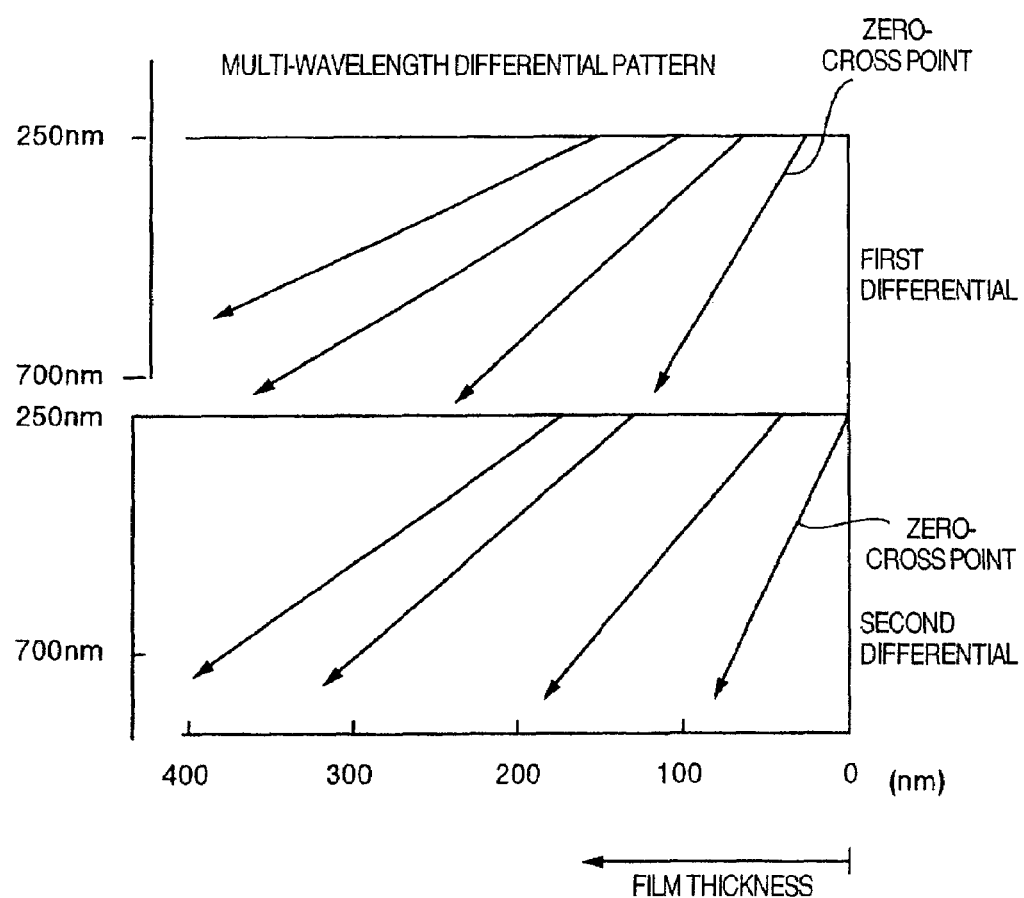
FIG. 15 is a graph for denoting the operation of the embodiment shown in FIG. 11.

According to the test performed by the present inventors, for example, when in processing of an insulation film, the zero-cross points to appear for the first and second differential waveform patterns having multiple wavelengths respectively are characteristic as shown in FIG. 15. Concretely, at a portion where the subject film is thick, zero-cross points appear for both first and second waveform patterns. At a portion where the film is thin, however, no zero-cross point appears for the first differential waveform pattern. At a portion where the film is thick, therefore, any of the wavelengths of the first and second different waveform patterns may be used as a guide wavelength λG or the target wavelength λT. At a portion where the film is thin, the wavelength of the first differential waveform pattern should preferably be used as the guide wavelength λG and the waveform of the second differential waveform pattern should preferably be used as the target wavelength λT. For example, when an insulation film is to be processed according to the characteristics shown in FIG. 15, the guide wavelength λG should be set to 475 nm. And, when the rest film thickness is 50 nm, the target wavelength λT should be set to 455 nm, which is a wavelength of the second differential waveform pattern or 475 nm, which is a wavelength of the first differential waveform pattern. When the rest film thickness is 15 nm or under, the second differential waveform pattern should be used as the target waveform λT. When the rest film thickness is within 15 nm to 35 nm, the first differential waveform pattern m=1 should be used as the target wavelength λT. When the rest film thickness is within 35 nm to 100 nm, the target waveform λT should be the first differential waveform pattern of m=2.

According to the film thickness measuring apparatus of the present invention as described above, therefore, it is possible to measure a film thickness of a member to be processed accurately in fabrication processes of semiconductor devices. Consequently, this system can be used to provide a method for etching the member precisely. Hereunder, such the fabrication processes of a semiconductor device will be described.

Figure 16:
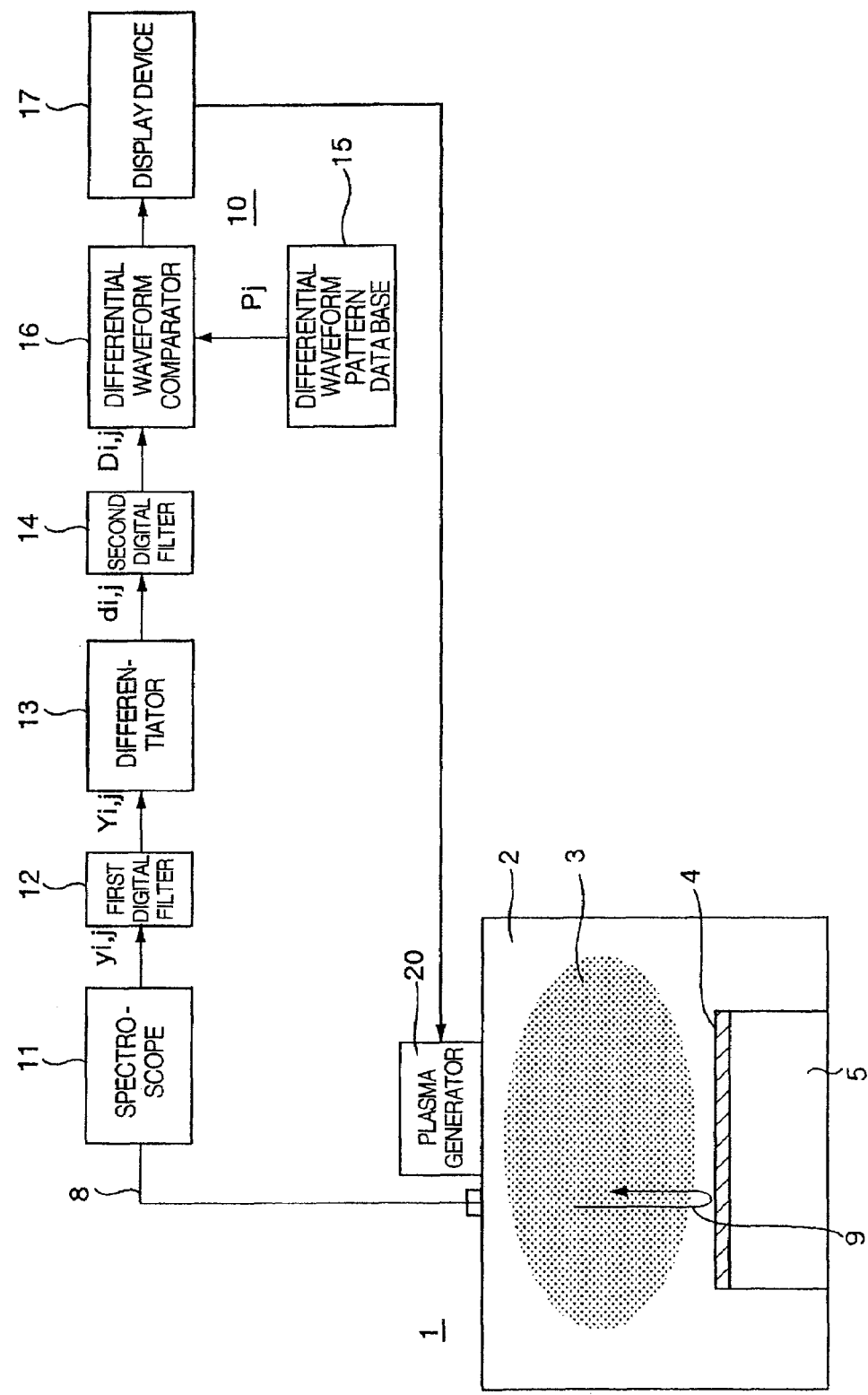
FIG. 16 is an entire block diagram of an etching apparatus for semiconductor wafers, which is provided with a film thickness measuring apparatus in the fifth embodiment of the present invention.
Figure 17A:
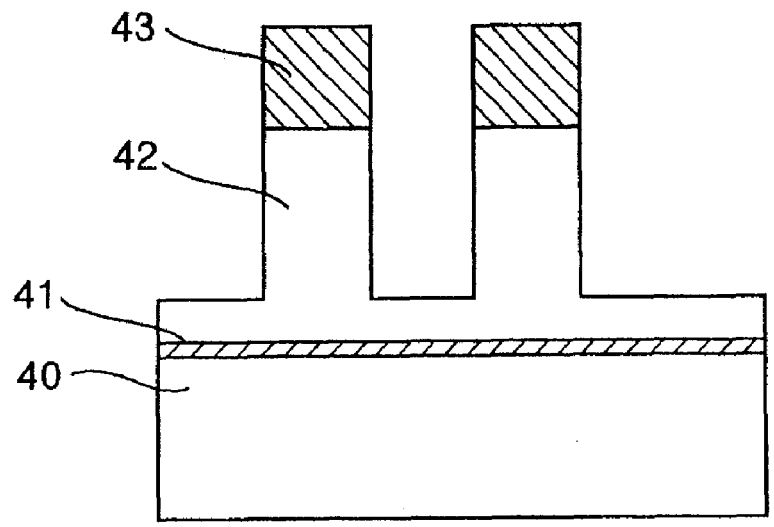
FIGS. 17A and 17B are cross sectional views of a member to be processed in etching process in the embodiment of FIG. 16.
Figure 17B:
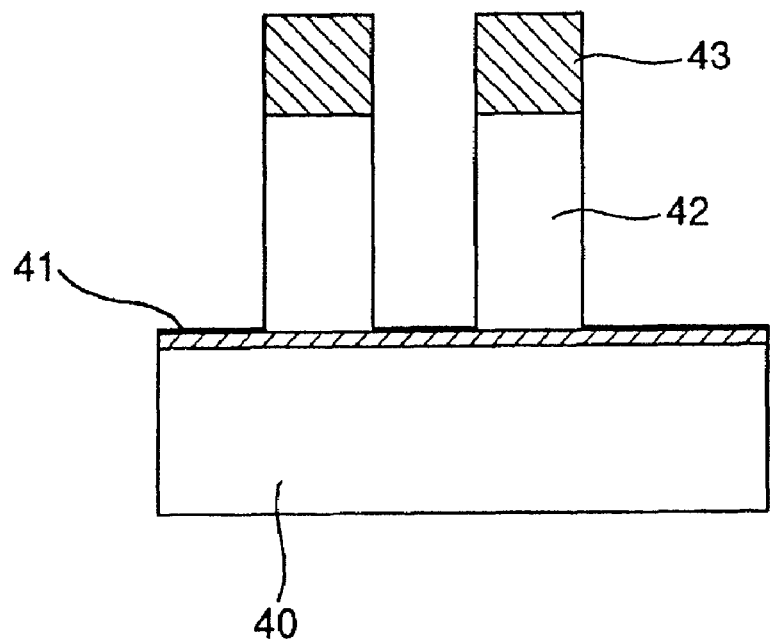

FIG. 16 is a block diagram of an etching apparatus that employs the first embodiment of the present invention described with reference in FIGS. 1 through 4. The film thickness data of a member to be processed, displayed on the display device 17, is transferred to a plasma generator 20 and used to control the condition for generating the plasma in a vacuum chamber. For example, the condition for generating the plasma in the vacuum chamber is changed for a member to be processed as shown in FIG. 17A according to the film thickness found by the film thickness measuring apparatus of the present invention, that is, the progress of the etching on the member, thereby the member can be etched into a properly shape as shown in FIG. 17B.

The components 12 to 16 in this embodiment may also be included in a computer provided with a CPU, memories, etc.

Hereunder, the procedure of such the etching processings will be described briefly.

At first, etching processing conditions for the target member to be processed are set. The conditions include the target film thickness of each layer of the member in accordance with the processing pattern, as well as the differential pattern data Pi and criterion σ0 of predetermined wavelength ranges (at least three wavelength ranges) for each film thickness that are read from the data base respectively. Then, the member is put on an electrode and the chamber is evacuated. After this, a predetermined process gas is charged into the vacuum chamber so as to generate plasma and start etching for the member. At the same time, sampling of the interference light is started. With the progress of the etching, the multi-wavelength light emission intensity changes. The light detector detects the intensity as a light detection signal of a voltage corresponding to a light emission intensity. The light detection signal output from the spectroscope 11 performs A/D conversion so as to calculate the sampling signal $y_{i,j}$. Then, the multi-wavelength signal $y_{i,j}$ output from the spectroscope 11 is smoothed to time series data $Y_{i,j}$. After this, the coefficient di (first or second differential value) of the signal waveform is calculated by a differential processing (S-G method), then smoothed to obtain smoothed differential coefficient time series data $D_{i,j}$. Then, the $\sigma=\Sigma(D_{i,j}-P_j)^2$ value is calculated, followed by a check for $\sigma \leqq \sigma 0$. In case $\sigma \leqq \sigma 0$ is satisfied, it is decided that the film thickness of the target member has reached the predetermined value. The etching is thus terminated and the process gas is discharged from the chamber. Finally, the target member is carried out from the vacuum chamber.

For example, in case the film thickness is to be set to the C value shown in FIG. 2A, the standard pattern is set in advance for each of the film thickness values A, B, and C. Each standard pattern denotes the wavelength dependence of a differential value. When the matching rate of the real pattern to the standard pattern in each of those wavelengths reaches a criterion of σ0 or under, the processing is controlled so that the rest film thickness of the target member is detected sequentially each time it reaches A and B, thereby the processing conditions including the supply of the process gas are changed properly until the thickness reaches C exactly. Then, the etching processing is terminated.

Depending on the etching progressing, the etching may be stopped once when a predetermined film thickness, for example, the film thickness A is detected, then it may be restarted after other necessary processings/operations are done. The etching processing conditions may be changed continuously according to the current film thickness while the precision film thickness measurement is continued.

The measuring method in another embodiment of the present invention may also be employed for controlling the etching. The present invention can also apply to such processings as plasma CVD, sputtering, CMP (Chemical Mechanical Polishing), and thermal CVD, etc.

Figure 19A:
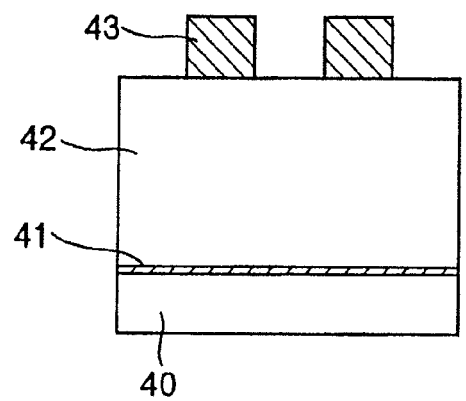
FIGS. 19A to 19C are cross sectional views of a member to be processed in etching process in the embodiment of FIG. 18.
Figure 19B:
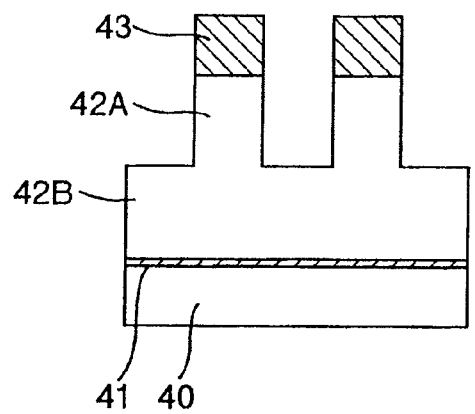
Figure 19C:
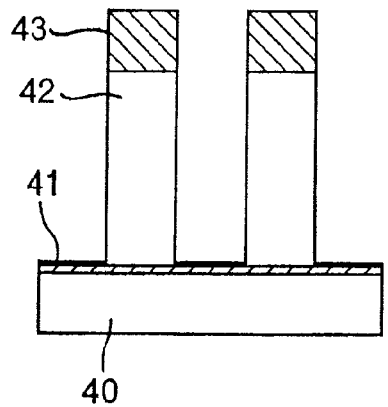

FIG. 18 shows another configuration of the etching apparatus in the first embodiment of the present invention. The film thickness data of a member to be processed, displayed on the display device 17, is processed by a controller 18, then transferred to a plasma generator 20, a gas supply device 21, and a wafer bias power source 22 sequentially. The data is used to control the conditions for generating the plasma in the vacuum chamber. For example, the target member film to be etched is thick just like in a hole processing of an insulation film, the etching processing is divided into two stages as shown in FIGS. 19A, 19B, and 19C and the processing conditions in the vacuum chamber are changed according to the film thickness measured by the film thickness measuring apparatus of the present invention, that is, the etching progress for the member to be etched (FIG. 19B). The processing can thus be speeded up and the under-coating material is etched into a proper shape as shown in FIG. 19C without over-etching. In this case, still another embodiment of the present invention may be employed for the same controlling of etching.

The components 12 to 16 in this embodiment may also be included in a computer provided with a CPU, memories, etc.

Figure 20:
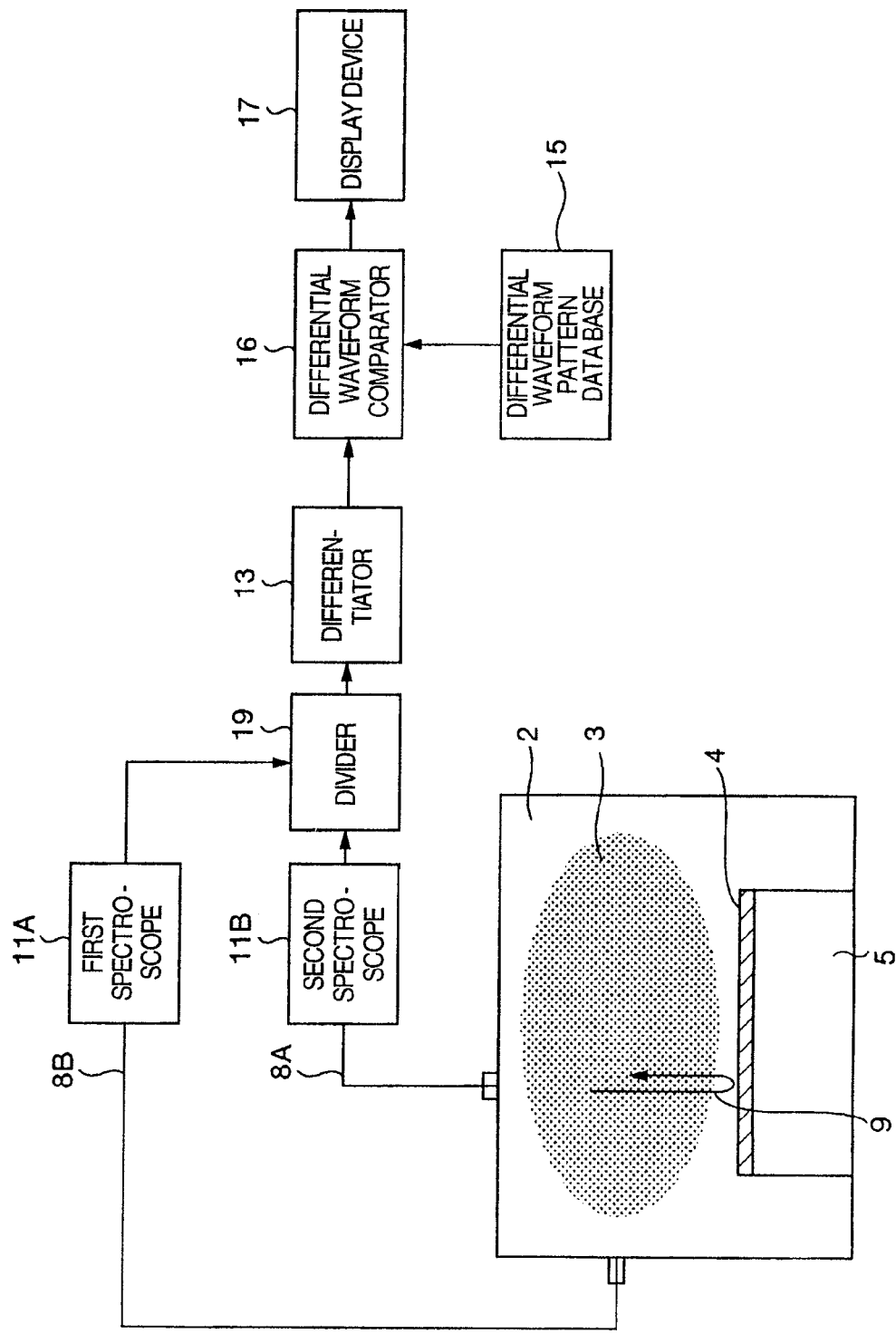
FIG. 20 is an entire block diagram of an etching apparatus for semiconductor wafers, which is provided with a film thickness measuring apparatus in the seventh embodiment of the present invention.

Each embodiment described above aims at measuring of a film thickness with use of an interference light caused by reflected lights from the member to be processed. The light that has caused the reflected lights are emitted from the spectroscope provided with a light source and has multiple wavelengths. The spectroscope may not be provided with a light source, however. In this case, a multiple-wavelength light having discharged by plasma may be used as a light source. For example, as shown in FIG. 20, the interference light exposed on the target member, caused by a plasma light, is led into a first spectrometer 11A so as to be observed from above through a port formed at the upper wall of the vacuum chamber 2 via an optical fiber, then the interference light is led into a second spectrometer 11B so that the state of the plasma light is observed from another port formed at a side wall of the vacuum chamber 2 of the spectroscope via an optical fiber. The interference lights led to those spectrometers are then processed in a divider 19 and led into a differentiator. After this, the light may be processed by the method described above. Any of the spectrometers 11A and 11B is not provided with a light source. The components 13, 15, 16, and 19 shown in FIG. 20 may also be included in a computer provided with a CPU, memories, etc.

According to the method described above, therefore, it is always possible to measure a film thickness accurately in a stable state without use of any independent light source even when the state of the plasma light changes with time. In addition, it is possible to detect an extension of the processing time when the state of the plasma processing apparatus changes with time due to an increase of the number of members to be processed. Maintenance commands can thus be issued at appropriate timings.

Next, a description will be made for the eighth embodiment of the present invention for improving the accuracy in measurement of film thickness. The state of plasma may change during actual etching processing. Sometimes, this may degrade such the accuracy in measurement of film thickness. FIG. 21 shows how a film thickness changes when in etching of polysilicon on a undercoating oxide film of 2.5 nm. Each block circle shows a measured film thickness each time it is measured in a pattern comparison of the present invention. In case the polysilicon film is thick and the interference light intensity from the polysilicon is weak in the initial stage of etching or in case the state of plasma changes during etching processing, the measured film thickness is often varied. In such a case, therefore, the following processings are performed by the software stored in the computer so as to improve the accuracy in measurement of film thickness. (1) Measurement of a film thickness is started at a time T1, for example, upon the lapse of 30 sec after the start of etching processing in FIG. 21 when the polysilicon film is still thin (ex., 175 nm or less) and the state of plasma does not change so much. (2) The return line (regression line) is calculated with reference to the measured film thickness value in the past. (3) The measured film thickness value that is off the return line is regarded as noise (for example, allowable value of the measured value not regarded as noise is ±10 nm). (4) A return line is calculated again from the measured film thickness value from which noise is removed. (5) The current film thickness is calculated from the return line calculated again and set as a fitted film thickness value. Hereinafter, the processings from (2) to (5) are repeated at a predetermined time interval so as to obtain the fitted value each time and the etching processing is continued until this fitted value reaches the final target film thickness Thf. When the fitted value reaches the value Thf, the etching processing is terminated.

Next, a description will be made for another embodiment of the present invention for monitoring the state of etching processing. A data string of the fitted value obtained each time is stored in a memory or in an external storage device of the computer. The data string of the fitted value stored in the memory or the storage device is configured as a data base so as to be corresponded to a wafer processing number. In this data base, in case a time for terminating etching processing exceeds, for example, +/−5% with respect to a pregiven etching processing terminating time or in case a fitted value obtained at a time (, for example time T2) during etching processing exceeds, for example, +/−5% with respect to a target fitted value (Th2 in FIG. 21) at the time T2, a warning message is output so as to denote that the etching processing shown by this wafer processing number is abnormal.

According to this method, therefore, it is possible to measure a film thickness even when measured film thickness is varied, thereby etching processing can be performed so as to decide a target film thickness precisely. It is also possible to monitor the state of etching processing, thereby the number of defective wafers to be generated in the processing can be minimized.

What is claimed is:

1. A system comprising:
an apparatus for processing a semiconductor wafer which performs a predetermined processing, as to a film on a surface of the semiconductor wafer to be processed disposed on a sample stand within a vacuum chamber, by using plasma generated within the vacuum chamber, the apparatus including:
a light source which emits light having multiple wavelengths within the vacuum chamber;
a port which is disposed so as to face on an inner surface of the vacuum chamber and through which light is transmitted from an inside of the vacuum chamber;
a light receiving unit which receives, through the port, interference lights of multiple wavelengths reflected from the surface of the semiconductor wafer based on the light emitted from the light source during the processing of the semiconductor wafer; and
a detecting device which detects a processed amount of the film during the processing of the semiconductor wafer based on a first pattern and a second pattern, wherein the first pattern is obtained by measuring intensities of the interference lights of multiple wavelengths received by the light receiving unit and obtaining a pattern of differential values of the measured interference light intensities using a wavelength as a parameter as the first pattern, and the second pattern is a pattern of differential values of intensities of interference lights of multiple wavelengths with respect to a predetermined processed amount of the film actually obtained in advance as to a sample semiconductor wafer having substantially same configuration as the semiconductor wafer a film thickness measuring apparatus for measuring a film thickness of a member to be processed, including:
a differential waveform pattern data base for holding a standard pattern consisting of a time differential value of an interference light for each of multiple wavelengths with respect to a film thickness of a first member to be processed;
a unit for measuring an intensity of an interference light for each of multiple wavelengths of a second member to be processed;
a unit for obtaining a real pattern consisting of time differential values of measured interference light intensities; and
a unit for determining a film thickness by using a pattern of zero-cross points of the differential values of intensities of the received interference light for a second wavelength among the received interference lights of the multiple wavelengths.

2. A system according to claim 1, comprising:
a unit which adjusts a processing of the film of the semiconductor wafer based on the detected processed amount of the film.

3. A system for processing a semiconductor wafer according to claim 1, wherein the second pattern is the pattern of the differential values of the intensities of interference lights of multiple wavelengths with respect to at least three predetermined processed amounts of the film actually obtained in advance as to the sample semiconductor wafer having substantially same configuration as the semiconductor wafer.

4. A system for processing a semiconductor wafer according to claim 1, wherein the light source is a halogen lamp.

5. An apparatus for processing a semiconductor wafer which performs a predetermined processing, as to a film on a surface of the semiconductor wafer to be processed disposed on a sample stand within a vacuum chamber, by using plasma generated within the vacuum chamber, comprising:
a light source which emits light having multiple wavelengths within the vacuum chamber;
a port which is disposed so as to face on an inner surface of the vacuum chamber and through which light is transmitted from an inside of the vacuum chamber;
a light receiving unit which receives, through the port, interference lights of multiple wavelengths reflected from the surface of the semiconductor wafer based on the light emitted from the light source during the processing of the semiconductor wafer; and
a detecting device which detects a processed amount of the film during the processing of the semiconductor wafer based on a first pattern and a second pattern, wherein the first pattern is obtained by measuring intensities of the interference lights of multiple wavelengths received by the light receiving unit and obtaining a pattern of differential values of the measured interference light intensities using a wavelength as a parameter as the first pattern, and the second pattern is a pattern of differential values of intensities of interference lights of multiple wavelengths with respect to a predetermined processed amount of the film actually obtained in advance as to a sample semiconductor wafer having substantially same configuration as the semiconductor wafer.

6. An apparatus for processing a semiconductor wafer according to claim 5, comprising:
a unit which adjusts a processing of the film of the semiconductor wafer based on the detected processed amount of the film.

7. An apparatus for processing a semiconductor wafer according to claim 5, wherein the second pattern is the pattern of the differential values of the intensities of interference lights of multiple wavelengths with respect to at least three predetermined processed amounts of the film actually obtained in advance as to the sample semiconductor wafer having substantially same configuration as the semiconductor wafer.

8. An apparatus for processing a semiconductor wafer according to claim 5, wherein the light source is a halogen lamp.

9. An apparatus for processing a semiconductor wafer which performs a predetermined processing, as to a film on a surface of the semiconductor wafer to be processed disposed on a sample stand within a vacuum chamber, by using plasma generated within the vacuum chamber, comprising:
  a light source which emits light having multiple wavelengths within the vacuum chamber;
  a port which is disposed so as to face on an inner surface of the vacuum chamber and through which light is transmitted from an inside of the vacuum chamber;
  a light receiving unit which receives, through the port, interference lights of multiple wavelengths reflected front the surface of the semiconductor wafer based on the light emitted from the light source during the processing of the semiconductor wafer; and
  a detecting device which measures intensities of the interference lights of multiple wavelength, then detects differential values of the measured interference light intensities, then obtains a range of a processing amount of the film by using a first zero-cross pattern which is formed by points where the differential values of the measured interference light intensities as to a first wavelength among the interference lights of multiple wavelength cross a zero value of the differential values, and detects a processed amount of the film during the processing of the semiconductor wafer from the obtained range of the processing amount of the film by using a second zero-cross pattern which is formed by points where the differential values of the measured interference light intensities as to a second wavelength among the interference lights of multiple wavelength cross the zero value of the differential values.

10. An apparatus for processing a semiconductor wafer according to claim 9, comprising:
  a unit which adjusts a processing of the film of the semiconductor wafer based on the detected processed amount of the film.

11. An apparatus for processing a semiconductor wafer according to claim 9, wherein the detecting device detects the processed amount of the film based on a number of times where the differential values of the measured interference light intensities as to the first or second wavelength among the interference lights of multiple wavelength cross the zero value of the differential values.

12. An apparatus for processing a semiconductor wafer according to claim 9, wherein the first zero-cross pattern is formed by points where first differential values of the measured interference light intensities as to the first wavelength among the interference lights of multiple wavelength cross the zero value of the differential values, and the second zero-cross pattern is formed by points where second differential values of the measured interference light intensities as to the second wavelength among the interference lights of multiple wavelength cross the zero value of the differential values.

13. An apparatus for processing a semiconductor wafer according to claim 9, wherein the light source is a halogen lamp.

* * * * *